(12) United States Patent
Hong et al.

(10) Patent No.: US 8,772,853 B2
(45) Date of Patent: Jul. 8, 2014

(54) ALL GRAPHENE FLASH MEMORY DEVICE

(75) Inventors: Augustin J. Hong, Los Angeles, CA (US); Ji-Young Kim, Los Angeles, CA (US); Kang-Lung Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 128 days.

(21) Appl. No.: 13/180,601

(22) Filed: Jul. 12, 2011

(65) Prior Publication Data
US 2013/0015429 A1 Jan. 17, 2013

(51) Int. Cl.
*H01L 29/778* (2006.01)
(52) U.S. Cl.
USPC ............. 257/315; 257/40; 257/320; 257/613; 257/E21.618; 257/E21.411; 438/149; 365/185.26
(58) Field of Classification Search
USPC ........... 257/40, 314, 315, 316, 318, 319, 320, 257/321, 613, E21.618, E21.411, E51.038; 438/149, 151; 365/185.26; 977/700, 977/734, 936, 943
See application file for complete search history.

(56) References Cited

U.S. PATENT DOCUMENTS

| | | | |
|---|---|---|---|
| 2009/0294832 A1* | 12/2009 | Kakoschke et al. | 257/324 |
| 2010/0213435 A1* | 8/2010 | Fujii et al. | 257/9 |
| 2011/0101365 A1* | 5/2011 | Kim et al. | 257/66 |
| 2012/0235118 A1* | 9/2012 | Avouris et al. | 257/27 |

OTHER PUBLICATIONS

Geim, A. K. et al., "The rise of graphene," Nature Materials, vol. 6, Mar. 2007, pp. 183-191.
Castro Neto, C. et al., "The electronic properties of graphene," Reviews of Modern Physics, vol. 81 No. 1, Jan.-Mar. 2009, pp. 109-164.
Chen, Z. et al., "Graphene nano-ribbon electronics," Physica E. vol. 40 No. 2, Dec. 2007, pp. 228-232.
Zhang, Y. B. et al., "Experimental observation of the quantum Hall effect and Berry's phase in graphene," Nature, vol. 438, Nov. 10, 2005, pp. 201-204.
Novoselov, K. S. et al., "Two-dimensional gas of massless Dirac fermions in graphene," Nature, vol. 438, Nov. 10, 2005, pp. 197-200.
Reina, A. et al., "Large area, few-layer graphene films on arbitrary substrates by chemical vapor deposition," Nano Letters, vol. 9, No. 1, Dec. 1, 2008, pp. 29-35.
Li, X. et al., "Large-area synthesis of high quality and uniform graphene films on copper foils," Science Express, vol. 324 No. 1312, May 7, 2009, 12 pages.
Li, X. et al., "Evolution of graphene growth on Ni and Cu by carbon isotope labeling," Nano Letters, vol. 9 No. 12, Aug. 2009, pp. 4269-4272.

(Continued)

*Primary Examiner* — Su Kim
(74) *Attorney, Agent, or Firm* — Withrow & Terranova, P.L.L.C.

(57) ABSTRACT

A Graphene Flash Memory (GFM) device is disclosed. In general, the GFM device includes a number of memory cells, where each memory cell includes a graphene channel, a graphene storage layer, and a graphene electrode. In one embodiment, by using a graphene channel, graphene storage layer, and graphene electrode, the memory cells of the GFM device are enabled to be scaled down much more than memory cells of a conventional flash memory device. More specifically, in one embodiment, the GFM device has a feature size less than 25 nanometers, less than or equal to 20 nanometers, less than or equal to 15 nanometers, less than or equal to 10 nanometers, or less than or equal to 5 nanometers.

21 Claims, 13 Drawing Sheets

(56) References Cited

OTHER PUBLICATIONS

Liao, L. et al., "High-k oxide nanoribbons as gate dielectrics for high mobility top-gated graphene transistors," PNAS, vol. 107, Apr. 13, 2010, pp. 6711-6715.

Liao, L. et al., "Top-gated graphene nanoribbon transistors with ultrathin high-k dielectrics," Nano Letters, May 12, 2010, pp. 1917-1921.

Kim, J. et al., "Novel vertical-stacked-array-transistor (VSAT) for ultra-high-density and cost-effective NAND flash memory devices and SSD (Solid State Drive)," 2009 Symposium on VSLI Technology Digest of Technical Papers, Jun. 16-18, 2009, pp. 186-187.

Hong, A.J. et al., "Metal nanodot memory by self-assembled block copolymer lift-off," Nano Letters, vol. 10, Dec. 3, 2009, pp. 224-229.

Guinea, F., "Charge distribution and screening in layered graphene systems," Physical Review B, vol. 75, Jun. 21, 2007, 7 pages.

Sui, Y. et al., "Screening and interlayer coupling in multilayer graphene field-effect transistors," Nano Letters, vol. 9 No. 8, Jul. 29, 2009, pp. 2973-2977.

Lee, N.J. et al., "The interlayer screening effect of graphene sheets investigated by Kelvin probe force microscopy," Applied Physics. Letters, vol. 95, 222107, Dec. 2, 2009, 3 pages.

Miyazaki, H. et al., "Resistance modulation of multilayer graphene controlled by the gate electric field," Semiconductor Science and Technology, vol. 25, 034008, Feb. 3, 2010, 9 pages.

Romero, H.E. et al., "n-type behavior of graphene supported on Si/SiO2 substrates," ACS Nano, vol. 2 No. 10, Sep. 20, 2008, pp. 2037-2044.

Liu, L. et al., "Graphene Oxidation: thickness-dependent etching and strong chemical doping," Nano Letters, vol. 8, No. 7, Jun. 19, 2008, pp. 1965-1970.

Chen, J. H. et al., "Intrinsic and extrinsic performance limits of graphene devices on doping," Nature Nano, vol. 3, Apr. 2008, pp. 206-209.

Wei, D. et al., "Synthesis of n-doped graphene by chemical vapor deposition and its electrical properties," Nano Letters, vol. 9 No. 5, Mar. 27, 2009, pp. 1752-1758.

Bae et al., "Roll-to-roll production of 30-inch graphene films for transparent electrodes," Nature Nanotechnology, Advance online publications, Jun. 20, 2010, 7 pages.

Farmer, D. B. et al., "Chemical doping and electron-hole conduction asymmetry in graphene devices," Nano Letters, vol. 9 No. 1, Jan. 14, 2009, pp. 389-392.

Zhu, Y. et al., "TiSi2/Si heteronanocrystal metal-oxide-semiconductor-field-effect-transistor memory," Appl. Phys. Letters, vol. 89, Dec. 7, 2006, pp. 233113-233115.

Campos-Delgado et al., "Thermal stability studies of CVD grown graphene nanoribbons: Defect annealing and loop formation," Chemical Physics letters, vol. 469, Feb. 2009, pp. 177-182.

Wendt, H. et al., "Contamination factors and their influence in microchip production," Second International Symposium on "Orbital Welding in High Purity Industries," La Baule, France, Oct. 8-9, 1998, 7 pages.

Bu, J. et al., "Design considerations in scaled SONOS nonvolatile memory devices," Solid-State Electronics, vol. 45, Jan. 2001, pp. 113-120.

Lee, C. et al., "Highly scalable NAND flash memory with robust immunity to program disturbance using symmetric inversion-type source and drain structure," 2008 Symposium on VLSI Technology Digest of Technical Papers, Jun. 17-19, 2008, pp. 118-119.

Kim, K., "Technology for sub-50nm DRAM and NAND flash manufacturing," International Electron Devices Meeting, Dec. 5, 2005, pp. 323-326.

Shi, Y. et al., "Characteristics of narrow channel MOSFET memory based on silicon nanocrystals," Japanese Journal of Applied Physics, Part I, vol. 38, Jan. 1999, pp. 2453-2456, Abstract only.

Li, X. et al., "Transfer of large-area graphene films for high-performance transparent conductive electrodes," Nano Letters, vol. 9 No. 12, Oct. 21, 2009, pp. 4359-4363.

Farmer, D. B. et al., "Utilization of a buffered dielectric to achieve high field-effect carrier mobility in graphene transistors," Nano Letters, vol. 9 No. 12, Nov. 2, 2009, pp. 4474-4478.

Yu et al., "Improving channel mobility in graphene-FETS by minimizing surface phonon scattering—a simulation study," SISPAD, Sep. 6-8, 2010, pp. 13-16.

Pavan et al., "Flash memory cells—an overview," Proceedings of the IEEE, vol. 85 No. 8, Aug. 1997, pp. 1248-1271.

Xia et al., "Graphene field-effect transistors with high on/off current ratio and large transport band gap at room temperature," Nano Letters, vol. 10, Jan. 2010, pp. 715-718.

\* cited by examiner

ALL GRAPHENE FLASH MEMORY DEVICE

FIELD OF THE DISCLOSURE

The present disclosure relates to flash memory and more particularly relates to an all graphene flash memory device.

BACKGROUND

With the proliferation of digital devices, and in particular mobile devices, there is an increasing demand for high capacity, low power non-volatile memory. Currently, one of the most used types of non-volatile memory is flash memory. Flash memory is used in mobile smart phones, portable media players, video cameras, memory cards, Universal Serial Bus (USB) flash drives, gaming consoles, and the like. Further, flash memory has started to replace conventional hard disk drives, providing a solid-state alternative with low power consumption, greater reliability, and reduced size and weight particularly for mobile applications. High demand has led to rapid innovation in the design of flash memory devices, with high scalability resulting from the fact that each memory cell consists of only a single transistor and corresponding storage element buried inside the gate, or control, stack.

The conventional flash memory device includes a number of memory cells, where each memory cell is a floating gate transistor, comprised of a p-type Silicon substrate, a tunnel oxide, a highly doped n-type polysilicon storage layer (i.e., a floating gate), a control oxide, and a metallic electrode. Writing is achieved by applying a voltage pulse on the electrode, which allows electrons to tunnel through the tunnel oxide from the Silicon substrate into the polysilicon storage layer. This causes a positive shift in the threshold voltage of the Silicon substrate and is simply the additional voltage required to compensate the stored charge underneath the control oxide. The binary values are defined by the current upon a read cycle at a voltage within the width of the threshold voltage shift.

The primary goal of most research in flash memory is to scale down the size of the memory cells to thereby increase the density of memory cells, which enables increased storage capacity for a given die area or further miniaturization for a given amount of storage. However, the conventional flash memory device is now reaching its limit in terms of scalability and thus storage capacity. The primary issues that limit further scaling of the conventional flash memory device are Short Channel Effect (SCE), which is not limited to flash memory devices but universal to all metal-oxide-semiconductor based transistors, and cell to cell interference (i.e., interference between adjacent memory cells). Thus, there is a need for a flash memory device that has strong immunity to SCE and cell-to-cell interference and therefore can be scaled down beyond the limits of traditional flash memory devices.

SUMMARY

A Graphene Flash Memory (GFM) device is disclosed. In general, the GFM device includes a number of memory cells, where each memory cell includes a graphene channel, a graphene storage layer, and a graphene electrode. In one embodiment, by using a graphene channel, graphene storage layer, and graphene electrode, the memory cells of the GFM device are enabled to be scaled down much more than memory cells of a conventional flash memory device. More specifically, in one embodiment, the GFM device has a feature size less than 25 nanometers, less than or equal to 20 nanometers, less than or equal to 15 nanometers, less than or equal to 10 nanometers, or less than or equal to 5 nanometers.

In one embodiment, the GFM device includes a substrate and a graphene channel layer on a surface of the substrate, where the memory cells are on the graphene channel layer. Further, in one particular embodiment, each memory cell includes a tunnel oxide on a surface of the graphene channel layer opposite the substrate, a graphene storage layer on a surface of the tunnel oxide opposite the graphene channel layer, a control oxide on a surface of the graphene storage layer opposite the tunnel oxide, and a graphene electrode on a surface of the control oxide opposite the graphene storage layer. In one embodiment, the substrate is a polymer substrate.

In another embodiment, the GFM device includes a substrate, a graphene channel layer on a surface of the substrate, and a tunnel oxide layer on a surface of the graphene channel layer opposite the substrate. Further, in one particular embodiment, each memory cell includes a graphene storage layer on a surface of the tunnel oxide layer opposite the graphene channel layer, a control oxide on a surface of the graphene storage layer opposite the tunnel oxide layer, and a graphene electrode on a surface of the control oxide opposite the graphene storage layer. In one embodiment, the substrate is a polymer substrate.

In another embodiment, the GFM device includes a polymer substrate, a graphene channel layer on a surface of the polymer substrate, and an additional polymer layer on a surface of the graphene channel layer opposite the polymer substrate. Further, in one particular embodiment, each memory cell includes a tunnel oxide on a surface of the additional polymer layer opposite the graphene channel layer, a graphene storage layer on a surface of the tunnel oxide opposite the additional polymer layer, a control oxide on a surface of the graphene storage layer opposite the tunnel oxide, and a graphene electrode on a surface of the control oxide opposite the graphene storage layer.

In another embodiment, the GFM device includes a polymer substrate, a graphene channel layer on a surface of the polymer substrate, an additional polymer layer on a surface of the graphene channel layer opposite the polymer substrate, and a tunnel oxide layer on a surface of the additional polymer layer opposite the graphene channel layer. Further, in one particular embodiment, each memory cell includes a graphene storage layer on a surface of the tunnel oxide layer opposite the additional polymer layer, a control oxide on a surface of the graphene storage layer opposite the tunnel oxide layer, and a graphene electrode on a surface of the control oxide opposite the graphene storage layer.

In another embodiment, the GFM device includes a substrate, one or more peripheral circuits on a surface of the substrate, a polymer interlayer over a surface of the one or more peripheral circuits opposite the substrate, and a graphene channel layer on a surface of the polymer interlayer opposite the one or more peripheral circuits, where the memory cells are on the graphene channel layer. Further, in one particular embodiment, each memory cell includes a tunnel oxide on a surface of the graphene channel layer opposite the polymer interlayer, a graphene storage layer on a surface of the tunnel oxide opposite the graphene channel layer, a control oxide on a surface of the graphene storage layer opposite the tunnel oxide, and a graphene electrode on a surface of the control oxide opposite the graphene storage layer. In one embodiment, the substrate is a polymer substrate.

In another embodiment, the GFM device includes a substrate, one or more peripheral circuits on a surface of the substrate, a polymer interlayer over a surface of the one or more peripheral circuits opposite the substrate, a graphene channel layer on a surface of the polymer interlayer opposite the one or more peripheral circuits, and a tunnel oxide layer on a surface of the graphene channel layer opposite the polymer interlayer. Further, in one particular embodiment, each memory cell includes a graphene storage layer on a surface of the tunnel oxide layer opposite the graphene channel layer, a control oxide on a surface of the graphene storage layer opposite the tunnel oxide layer, and a graphene electrode on a surface of the control oxide opposite the graphene storage layer. In one embodiment, the substrate is a polymer substrate.

In another embodiment, the GFM device includes a substrate, one or more peripheral circuits on a surface of the substrate, a polymer interlayer over a surface of the one or more peripheral circuits opposite the substrate, a graphene channel layer on a surface of the polymer interlayer opposite the one or more peripheral circuits, and an additional polymer layer on a surface of the graphene channel layer opposite the polymer interlayer. Further, in one particular embodiment, each memory cell includes a tunnel oxide on a surface of the additional polymer layer opposite the graphene channel layer, a graphene storage layer on a surface of the tunnel oxide opposite the additional polymer layer, a control oxide on a surface of the graphene storage layer opposite the tunnel oxide, and a graphene electrode on a surface of the control oxide opposite the graphene storage layer. In one embodiment, the substrate is a polymer substrate.

In another embodiment, the GFM device includes a substrate, one or more peripheral circuits on a surface of the substrate, a polymer interlayer over a surface of the one or more peripheral circuits opposite the substrate, a graphene channel layer on a surface of the polymer interlayer opposite the one or more peripheral circuits, an additional polymer layer on a surface of the graphene channel layer opposite the polymer interlayer, and a tunnel oxide layer on a surface of the additional polymer layer opposite the graphene channel layer. Further, in one particular embodiment, each memory cell includes a graphene storage layer on a surface of the tunnel oxide layer opposite the additional polymer layer, a control oxide on a surface of the graphene storage layer opposite the tunnel oxide layer, and a graphene electrode on a surface of the control oxide opposite the graphene storage layer. In one embodiment, the substrate is a polymer substrate.

In another embodiment, the GFM device includes multiple stacked layers of memory cells. Further, in one particular embodiment, each layer of memory cells includes a polymer layer and a graphene channel layer on a surface of the polymer layer. For each memory cell in the layer of memory cells, the memory cell further includes a tunnel oxide on a surface of the graphene channel layer opposite the polymer layer, a graphene storage layer on a surface of the tunnel oxide opposite the graphene channel layer, a control oxide on a surface of the graphene storage layer opposite the tunnel oxide, and a graphene electrode on a surface of the control oxide opposite the graphene storage layer.

In another embodiment, the GFM device includes multiple stacked layers of memory cells. Further, in one particular embodiment, each layer of memory cells includes a polymer layer, a graphene channel layer on a surface of the polymer layer, and a tunnel oxide layer on a surface of the graphene channel layer opposite the polymer layer. For each memory cell in the layer of memory cells, the memory cell further includes a graphene storage layer on a surface of the tunnel oxide layer opposite the graphene channel layer, a control oxide on a surface of the graphene storage layer opposite the tunnel oxide layer, and a graphene electrode on a surface of the control oxide opposite the graphene storage layer.

In another embodiment, the GFM device includes multiple stacked layers of memory cells. Further, in one particular embodiment, each layer of memory cells includes a polymer layer, a graphene channel layer on a surface of the polymer layer, and an additional polymer layer on a surface of the graphene channel layer opposite the polymer layer. For each memory cell in the layer of memory cells, the memory cell further includes a tunnel oxide on a surface of the additional polymer layer opposite the graphene channel layer, a graphene storage layer on a surface of the tunnel oxide opposite the additional polymer layer, a control oxide on a surface of the graphene storage layer opposite the tunnel oxide, and a graphene electrode on a surface of the control oxide opposite the graphene storage layer.

In another embodiment, the GFM device includes multiple stacked layers of memory cells. Further, in one particular embodiment, each layer of memory cells includes a polymer layer, a graphene channel layer on a surface of the polymer layer, an additional polymer layer on a surface of the graphene channel layer opposite the polymer layer, and a tunnel oxide layer on a surface of the additional polymer layer opposite the graphene channel layer. For each memory cell in the layer of memory cells, the memory cell further includes a graphene storage layer on a surface of the tunnel oxide layer opposite the additional polymer layer, a control oxide on a surface of the graphene storage layer opposite the tunnel oxide layer, and a graphene electrode on a surface of the control oxide opposite the graphene storage layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 8B:
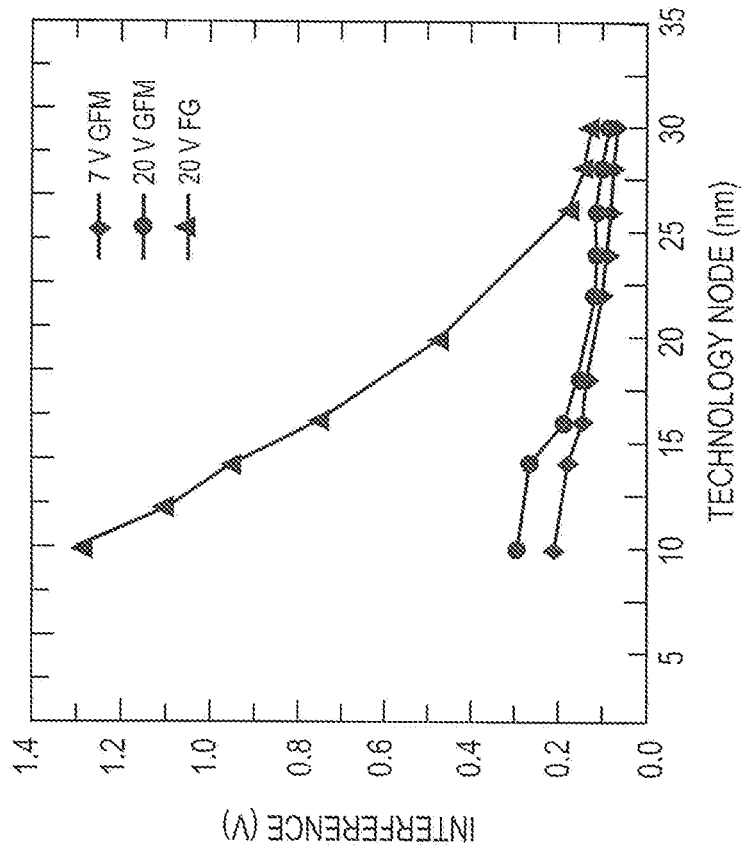
Figure 8A:
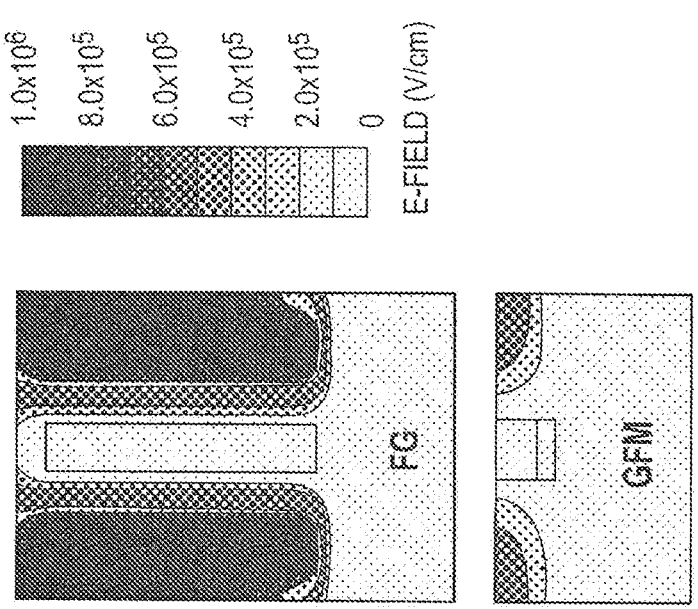
Figure 9A:
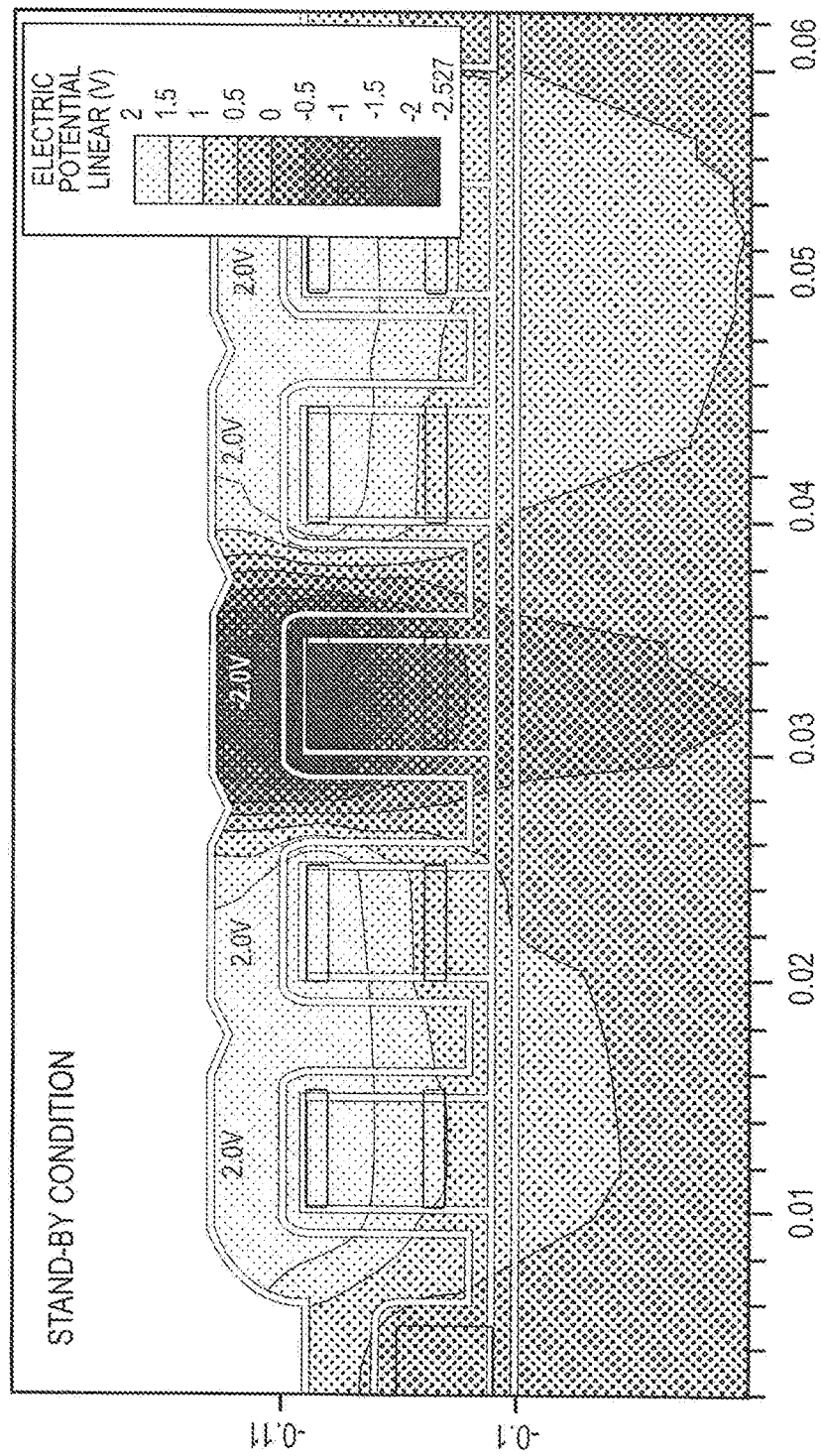
Figure 9B:
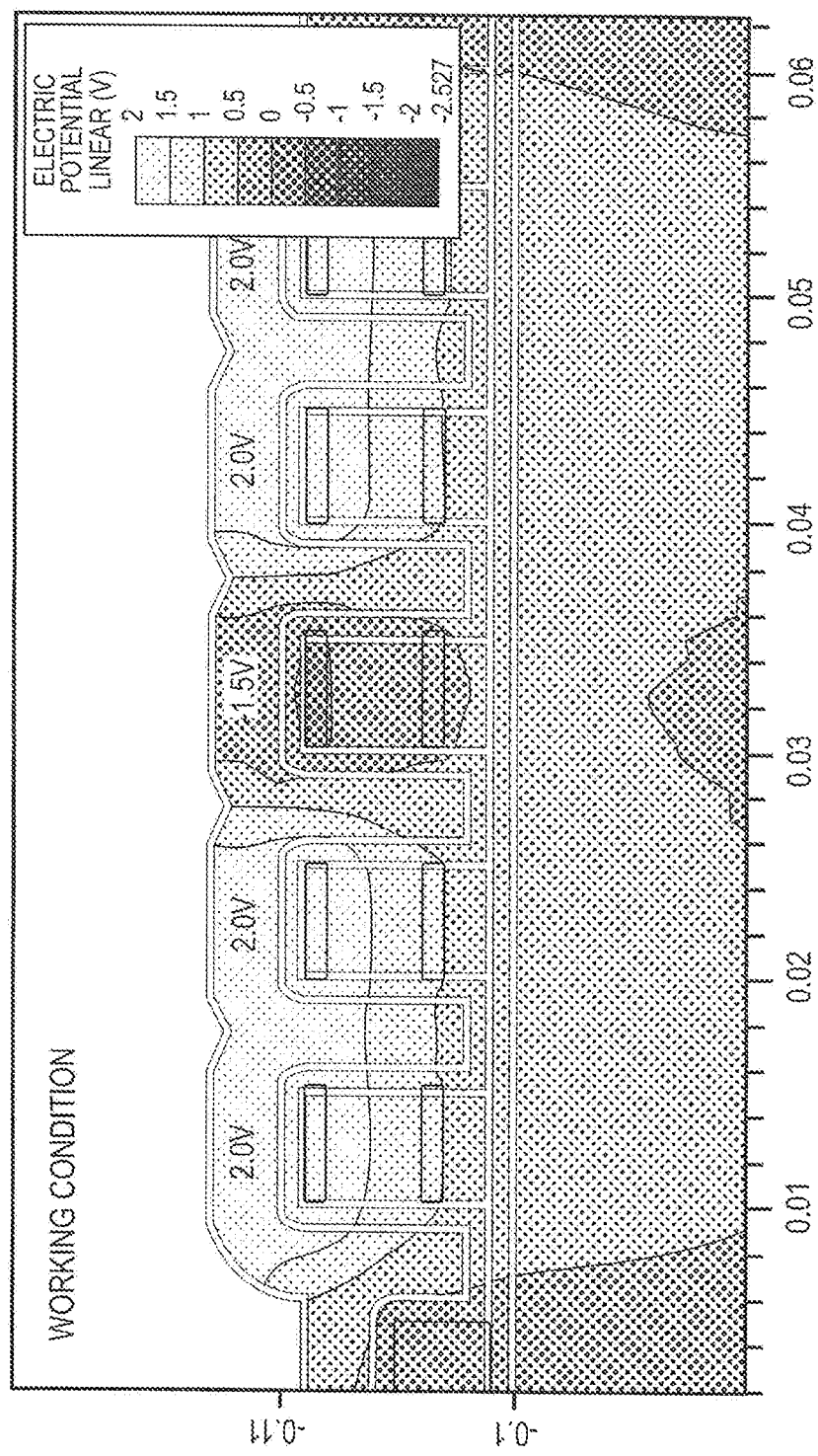
Figure 9C:
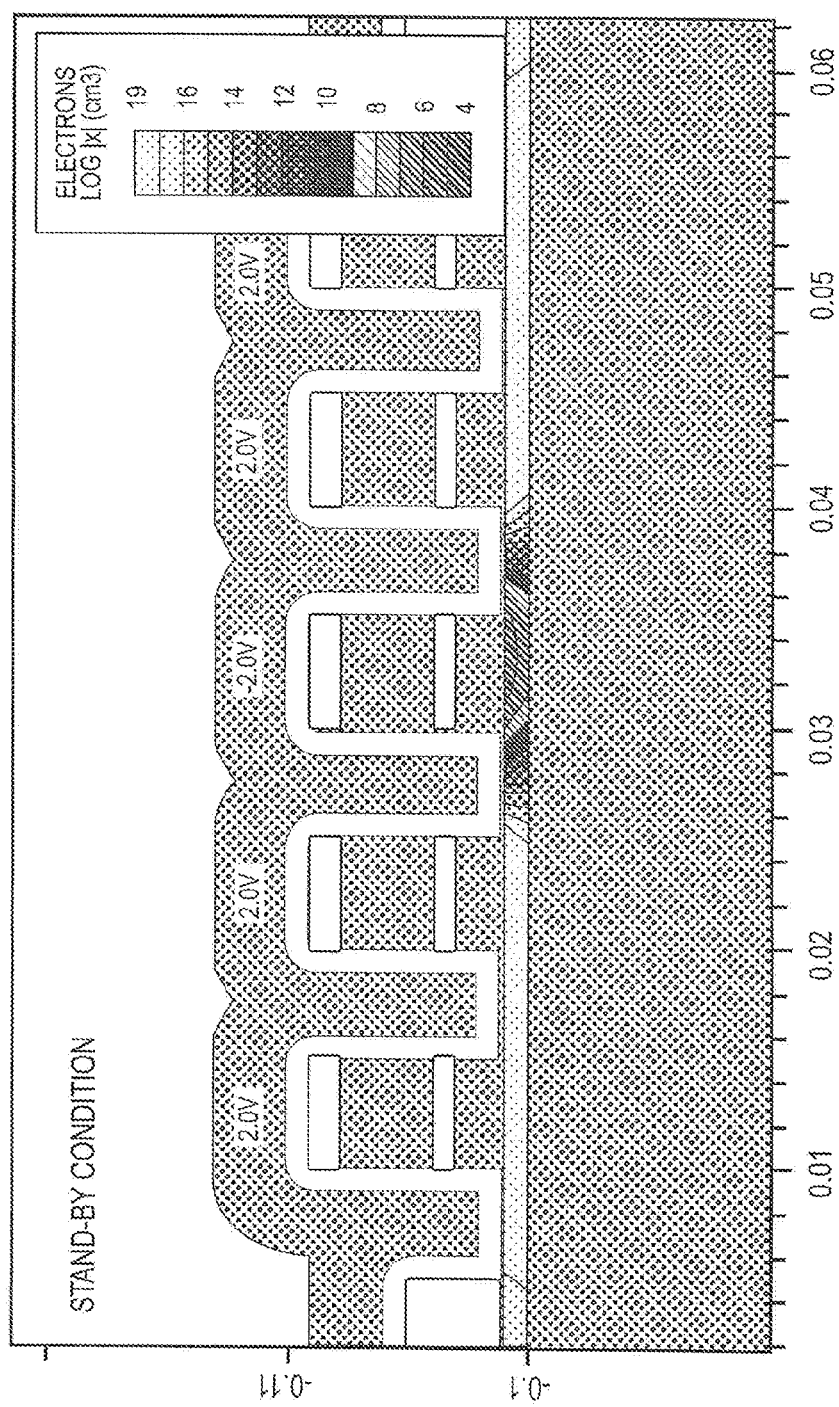
Figure 9D:
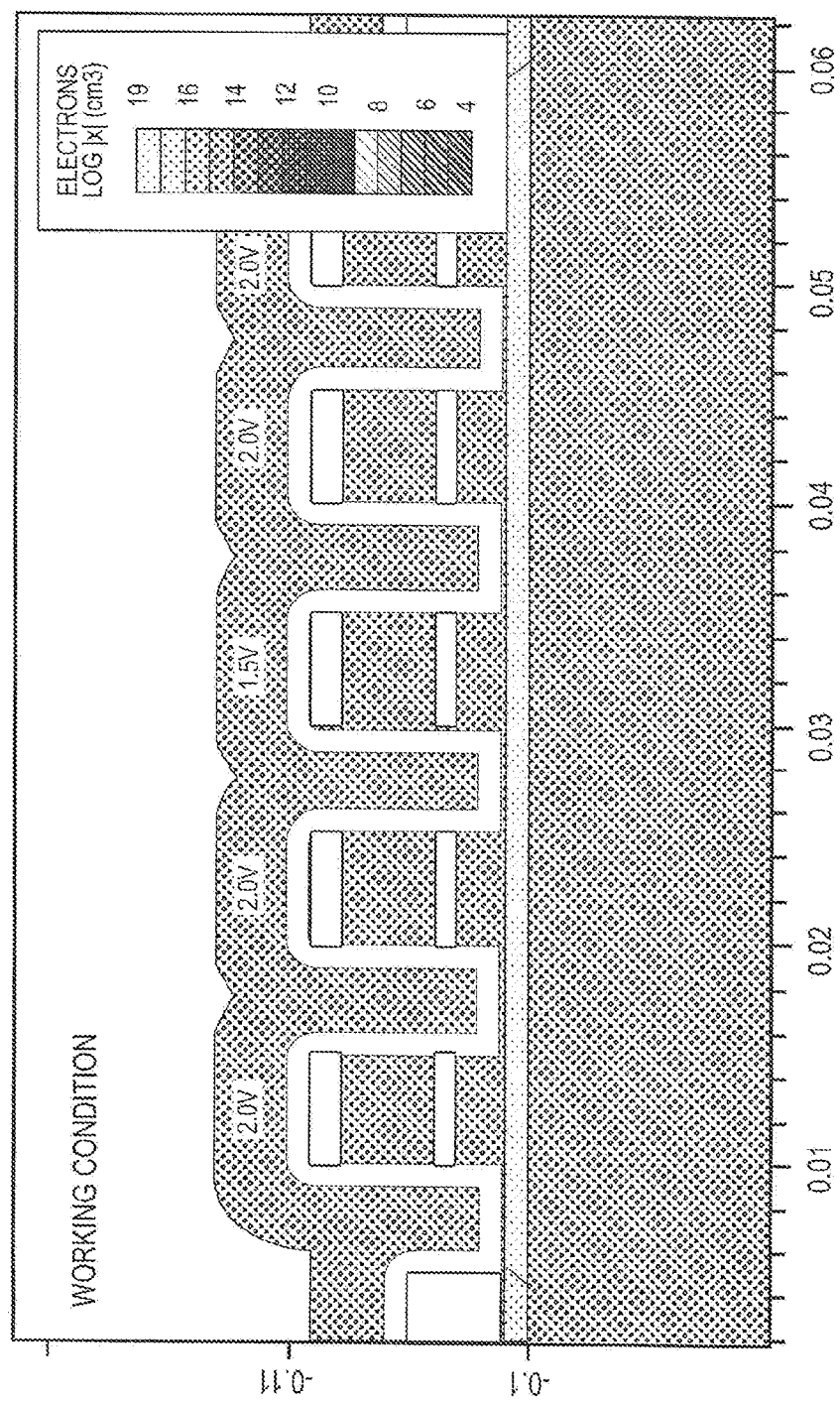
Figure 10B:
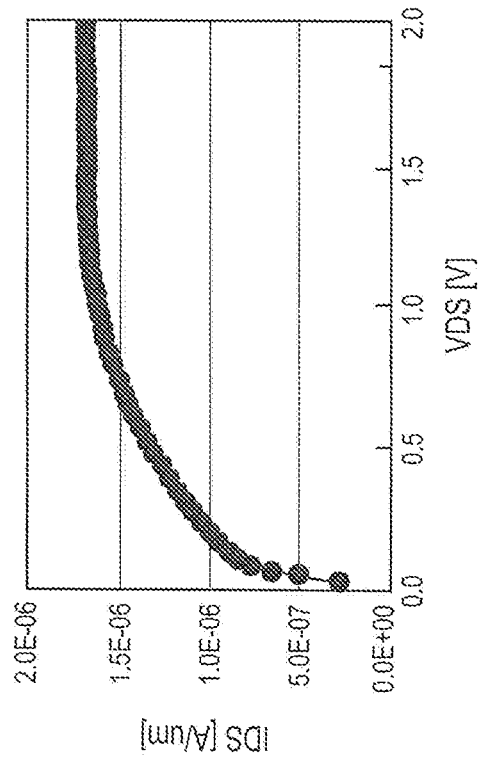
Figure 10A:
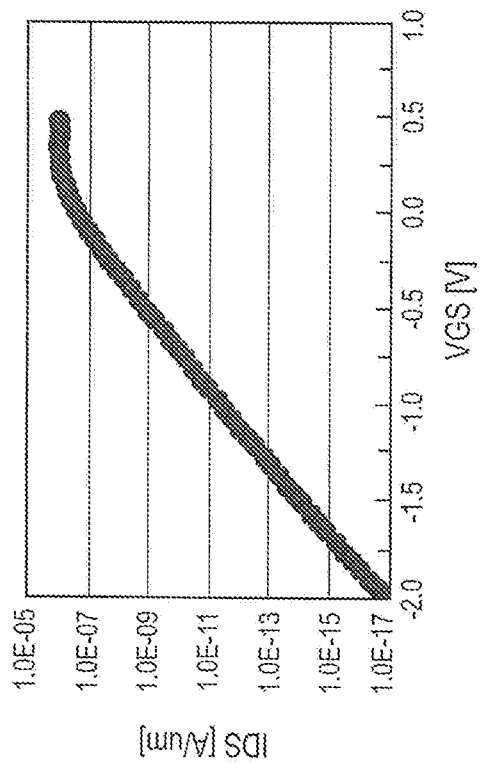

FIGS. 8A and 8B graphically compare cell-to-cell interference for memory cells of an exemplary GFM device and memory cells of a conventional flash memory device according to one embodiment of the present disclosure;

FIGS. 9A through 9D illustrate electric potential and hole concentration for memory cells of an exemplary embodiment of a GFM device having a 5 nanometer feature size during two read operations according to one embodiment of the present disclosure; and FIGS. 10A and 10B illustrate direct current (DC) performance of memory cells of an exemplary GFM device having a 5 nanometer feature size according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
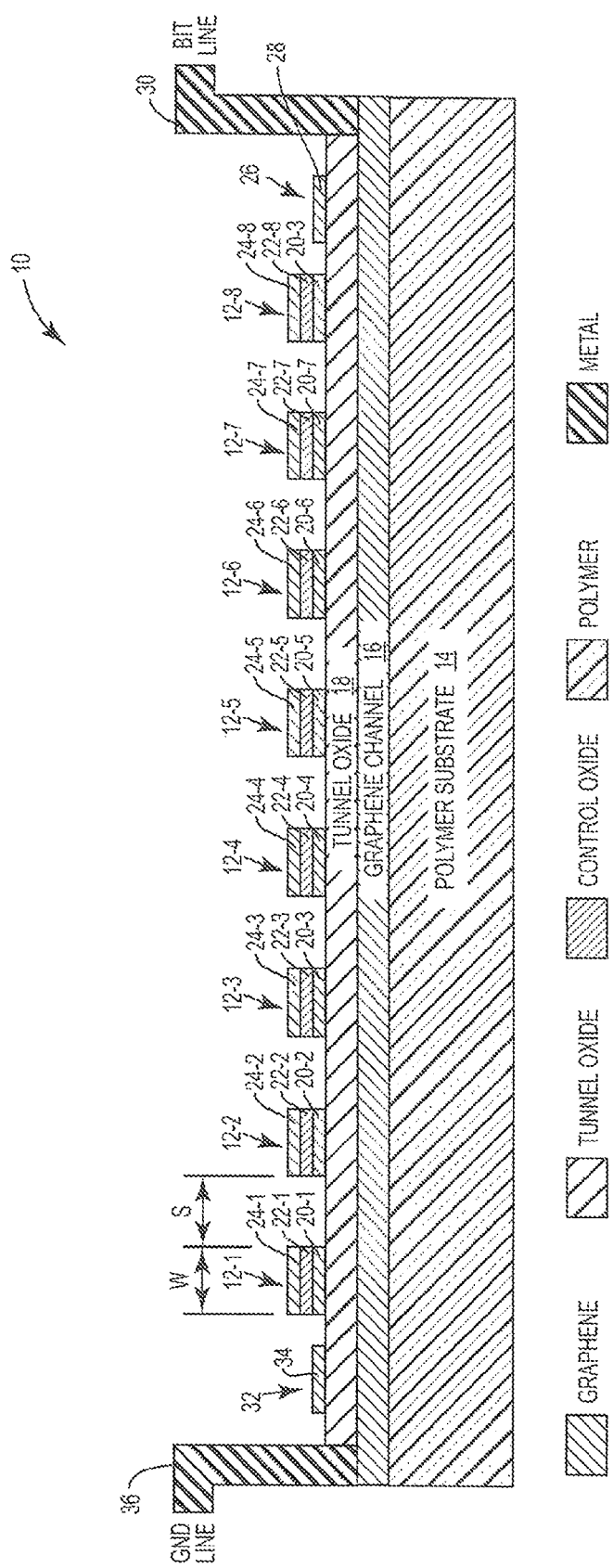
FIG. 1 illustrates a Graphene Flash Memory (GFM) device according to one embodiment of the present disclosure.

FIG. 1 illustrates an all Graphene Flash Memory (GFM) device 10 according to one embodiment of the present disclosure. The GFM device 10 includes a number of memory cells 12-1 through 12-8 (generally referred to herein collectively as memory cells 12 and individually as memory cell 12). While only eight memory cells 12 are illustrated, it should be appreciated that the GFM device 10 can include any number of memory cells 12 (e.g., trillions of memory cells 12). In this embodiment, the memory cells 12 are configured in a NAND flash memory configuration such that the GFM device 10 is a NAND-type flash memory device.

More specifically, the GFM device 10 includes a polymer substrate 14, a graphene channel layer 16 on a surface of the polymer substrate 14, and a tunnel oxide layer 18 on a surface of the graphene channel layer 16 opposite the polymer substrate 14. In this embodiment, the graphene channel layer 16 and the tunnel oxide layer 18 are shared by the memory cells 12. The polymer substrate 14 is generally formed of a polymer. While any suitable polymer may be used, as one example, the polymer is the polymer NFC 1400-3CP (JSR Micro, Inc.), which is commercially available and is a derivative of polyhydroxystyrene. It should be noted that the GFM device 10 may alternatively be formed on another type of substrate such as, for example, a Silicon substrate.

The graphene channel layer 16 is preferably a monolayer (i.e., a single atomic layer) of graphene. Notably, in the embodiment where the graphene channel layer 16 is a monolayer of graphene, a channel width of each of the memory cells 12 is sufficiently small to open up a bandgap. The channel width corresponds to a control contact, or gate, width (W) of each of the memory cells 12. Preferably, the channel width is less than 20 nanometers (nm). The isolation of the memory cells 12 from one another and the small channel width opens up a bandgap in the monolayer of graphene. While the graphene channel layer 16 is preferably a monolayer of graphene, the graphene channel layer 16 may alternatively include more than one atomic layer of graphene as long as the graphene channel maintains a suitable bandgap. For example, the graphene channel layer 16 may alternatively be a bilayer of graphene (i.e., two atomic layers of graphene).

The tunnel oxide layer 18 is preferably formed of a low-temperature, high dielectric constant (k) oxide such as, for example, Aluminum Oxide ($Al_2O_3$), Hafnium Oxide (HfO), Silicon Dioxide ($SiO_2$), or the like. Further, the tunnel oxide layer 18 has a thickness that is sufficiently thin to allow tunneling of electrons into the graphene channel layer 16 when erasing the memory cells 12. In one embodiment, the thickness of the tunnel oxide layer 18 is in a range of and including 5 to 7 nm.

In addition, for the memory cells 12-1 through 12-8, the GFM device 10 includes corresponding control, or gate, stacks including graphene storage layers 20-1 through 20-8 (generally referred to herein collectively as graphene storage layers 20 and individually as graphene storage layer 20) on a surface of the tunnel oxide layer 18 opposite the graphene channel layer 16, control oxide layers 22-1 through 22-8 (generally referred to herein collectively as control oxide layers 22 and individually as control oxide layer 22) on corresponding surfaces of the graphene storage layers 20-1 through 20-8 opposite the tunnel oxide layer 18, and graphene electrodes 24-1 through 24-8 (generally referred to herein collectively as graphene electrodes 24 and individually as graphene electrode 24) on corresponding surfaces of the control oxide layers 22-1 through 22-8 opposite the graphene storage layers 20-1 through 20-8. The graphene storage layers 20 are formed of one or more atomic layers of graphene (i.e., the graphene storage layer 20-1 includes one or more atomic layers of graphene, etc.). In one embodiment, the graphene storage layers 20 are formed of a monolayer of graphene (i.e., a single atomic layer of graphene). In another embodiment, the graphene storage layers 20 are formed of multiple atomic layers of graphene. In one exemplary embodiment, the graphene storage layers 20 are formed of 1 to 4 atomic layers of graphene. Work function engineering of the graphene storage layers 20 can be utilized to significantly affect the program/erase capability and data retention time of the memory cells 12. Because graphene's work function is equivalent to the Fermi energy, the work function of graphene can be controlled by substitutional, physiabsorbed, and chemical doping. Further, Chemical Vapor Deposition (CVD) graphene shows excellent thermal stability well above device processing temperature and therefore defects in graphene can be cured by heat treatment.

The control oxide layers 22 are preferably formed of a low-temperature, high dielectric constant (k) oxide such as, for example, $Al_2O_3$, HfO, $SiO_2$, or the like. The control oxide layers 22 have a thickness that is greater than that of the tunnel oxide layer 18. In one embodiment, a thickness of the control oxide layers 22 is in a range of and including 10 to 30 nm. The graphene electrodes 24 are formed of one or more atomic layers of graphene (i.e., the graphene electrode 24-1 includes one or more atomic layers of graphene, etc.). In one embodiment, the graphene electrodes 24 are formed of a monolayer of graphene. In another embodiment, the graphene electrodes 24 are formed of multiple atomic layers of graphene. In one exemplary embodiment, the graphene electrodes 24 are formed of 1 to 4 atomic layers of graphene.

The memory cells 12 form an array of memory cells connected in series. More specifically, the memory cells 12 are floating gate transistors (i.e., the graphene storage layers 20 form "floating gates" of corresponding transistors) connected in series such that a source of one the memory cells 12 is connected to a drain of the adjacent memory cell 12 in the memory cell array. A source select gate 26 formed by a graphene electrode 28 on the surface of the tunnel oxide layer 18 opposite the graphene channel layer 16 connects the array of memory cells 12 to an on-chip interconnect 30 that forms a bit line of the GFM device 10. Specifically, the source select gate 26 connects the memory cell 12-8 to the bit line when active (i.e., turned on) and disconnects the memory cell 12-8 from the bit line when inactive (i.e., turned off). Similarly, a ground select gate 32 formed by a graphene electrode 34 on the surface of the tunnel oxide layer 18 opposite the graphene channel layer 16 connects the array of memory cells 12 to an on-chip interconnect 36 that forms a ground line of the GFM device 10. Specifically, the ground select gate 32 connects the memory cell 12-1 to the ground line when active (i.e., turned on) and disconnects the memory cell 12-1 from the ground line when inactive (i.e., turned off).

The GFM device 10 operates in the same manner as a conventional NAND flash memory device. In general, each memory cell 12 is programmed by applying a relatively high voltage pulse to the graphene electrode 24 (i.e., the control electrode) of the memory cell 12 such that electrons are injected into the graphene storage layer 20 from the graphene channel layer 16 through the tunnel oxide layer 18 via hot electron injection. The resulting charge stored in the graphene storage layer 20 increases a threshold voltage of the memory cell 12 to a high threshold voltage. This high threshold voltage is read as a digital logic value "0." The memory cell 12 is erased by applying a relatively large negative voltage pulse to the graphene electrode 24 (i.e., the control electrode) of the memory cell 12 such that electrons stored in the graphene storage layer 20 are drained through the graphene channel layer 16 by tunneling through the tunnel oxide layer 18. In other words, the graphene storage layer 20 is discharged through the graphene channel layer 16. As a result of the discharging of the graphene storage layer 20, the threshold voltage of the memory cell 12 is lowered back to a low threshold voltage, which is read as a digital logic value "1."

Using the graphene channel layer 16, the graphene storage layers 20, and the graphene electrodes 24, the GFM device 10 has substantial benefits over the conventional material used for flash memory devices. First, the graphene channel layer 16, the graphene storage layers 20, and the graphene electrodes 24 enable the GFM device 10 to be scaled down far below that possible for conventional flash memory devices. Conventional flash memory devices cannot be scaled down below a 25 nm feature size (i.e., gate width and source/drain spacing). However, the GFM device 10 can be scaled down well below a 25 nm feature size. In one embodiment, the GFM device 10 has a feature size of less than 25 nm. In another embodiment, the GFM device 10 has a feature size of less than or equal to 20 nm. In another embodiment, the GFM device 10 has a feature size of less than or equal to 15 nm. In another embodiment, the GFM device 10 has a feature size of less than or equal to 10 nm. In another embodiment, the GFM device 10 has a feature size of less than or equal to 5 nm. As used herein, a feature size includes at least a control contact width (i.e., gate width) of the memory cells 12, which is illustrated as W, or a source/drain spacing (S) of the GFM device 10. Thus, for example, in one embodiment, the control contact width (W) is less than or equal to 5 nm, and the source/drain spacing (S) is less than or equal to 5 nm. As a result of the increased scalability of the GFM device 10, the GFM device 10 is enabled to include a substantially greater number of memory cells 12 than a conventional flash memory device using the same die area.

The increased scalability of the GFM device 10 is a result of at least two factors. First, the graphene channel layer 16, the graphene storage layers 20, and the graphene electrodes 24 are substantially thinner than corresponding components of the conventional flash memory device. As a result, the GFM device 10 has much greater immunity to Short Channel Effects (SCEs) and much lower cell-to-cell interference. Cell-to-cell interference is interference between adjacent memory cells 12 that results in bit errors. Second, the graphene storage layers 20 have a much higher storage capacity, or density of states, than conventional storage layers which are typically formed of polysilicon. Thus, using graphene, the number of bits that can be stored per unit area is substantially increased. As a result of the greater immunity to SCEs, lower cell-to-cell interference, and increased storage capacity, the GFM device 10 can be scaled down much farther than the conventional flash memory device.

A second benefit of the GFM device 10 is lower power consumption. As discussed below, the graphene storage layers 20 use lower program/erase voltages than the conventional flash memory device, which in turn decreases the power consumption of the GFM device 10. In one exemplary embodiment, the GFM device 10 requires half the operating voltage (i.e., program/erase voltages) to achieve at least a 1.5 volt (V) memory window, which results in a ~75% reduction in power consumption per bit as compared to a conventional flash memory device.

In addition to the benefits provided by the graphene channel layer 16, the graphene storage layers 20, and the graphene electrodes 24, the GFM device 10 has benefits resulting from the use of the polymer substrate 14. The polymer substrate 14 increases a channel mobility of the graphene channel layer 16 by decreasing surface phonon scattering. As a result of the increased channel mobility, the GFM device 10 can have either lower power consumption or higher speed.

Figure 2:
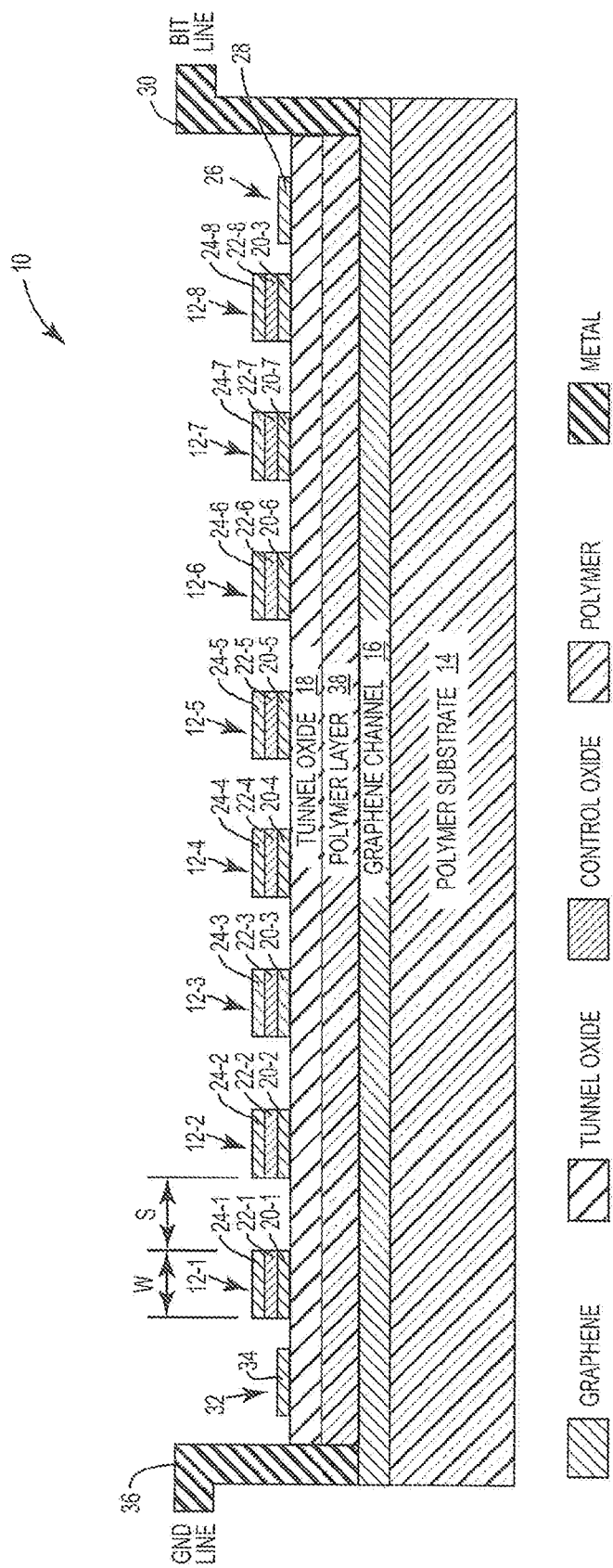
FIG. 2 illustrates a GFM device like that of FIG. 1 but further including a polymer control stack layer according to another embodiment of the present disclosure.

FIG. 2 illustrates the GFM device 10 of FIG. 1 according to another embodiment of the present disclosure. This embodiment is the same as that of FIG. 1 but where an additional polymer layer 38 is included between the graphene channel layer 16 and the tunnel oxide layer 18. The additional polymer layer 38 further enhances the channel mobility of the graphene channel layer 16.

Figure 3:
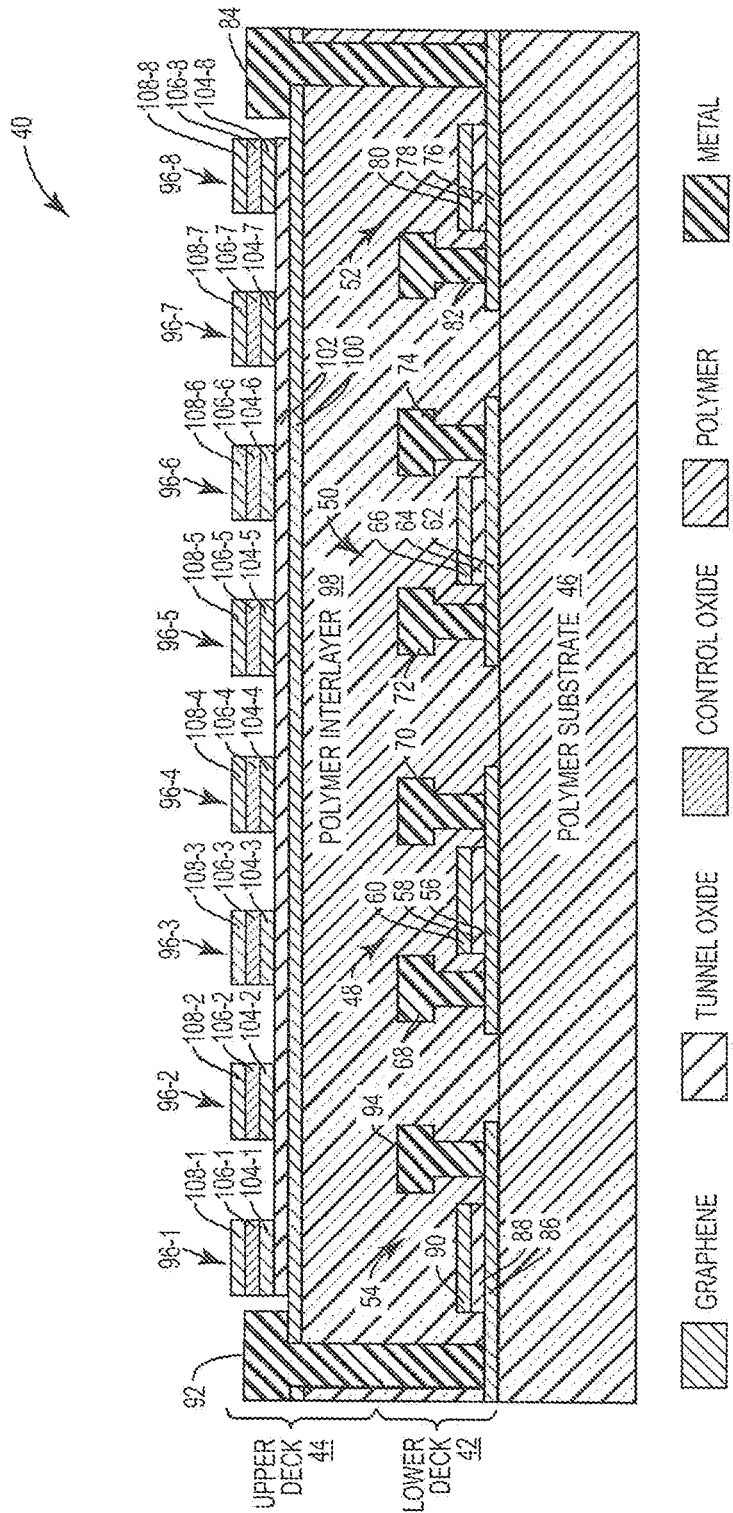
FIG. 3 illustrates a GFM device including two layers, namely, a first layer in which peripheral transistors for one or more peripheral circuits are formed and a second layer in which a number of memory cells for the GFM device are formed according to another embodiment of the present disclosure.

FIG. 3 illustrates a GFM device 40 according to another embodiment of the present disclosure. The GFM device 40 includes two layers or "decks," which are referred to as a lower deck 42 and an upper deck 44. More specifically, the GFM device 40 includes a polymer substrate 46, the lower deck 42 on a surface of the polymer substrate 46, and the upper deck 44 on a surface of the lower deck 42 opposite the polymer substrate 46. The polymer substrate 46 is generally formed of a polymer. While any suitable polymer may be used, as one example, the polymer is the polymer NFC 1400-3CP (JSR Micro, Inc.), which is commercially available and is a derivative of polyhydroxystyrene. It should be noted that the GFM device 40 may alternatively be formed on another type of substrate such as, but not limited to, a Silicon substrate.

The lower deck 42 includes a number of peripheral transistors 48 and 50 that form one or more peripheral circuits, a source select gate 52, and a ground select gate 54. The peripheral transistor 48 is formed by a graphene channel 56 on the surface of the polymer substrate 46, a gate oxide layer 58 on a surface of the graphene channel 56 opposite the polymer substrate 46, and a graphene electrode 60 on a surface of the gate oxide layer 58 opposite the graphene channel 56. Similarly, the peripheral transistor 50 is formed by a graphene channel 62 on the surface of the polymer substrate 46, a gate oxide layer 64 on a surface of the graphene channel 62 opposite the polymer substrate 46, and a graphene electrode 66 on a surface of the gate oxide layer 64 opposite the graphene channel 62. Connections to and from sources and drains of the peripheral transistors 48 and 50 are made by corresponding on-chip connectors 68, 70, 72, and 74.

The source select gate 52 is formed by a graphene channel 76 on the surface of the polymer substrate 46, a gate oxide layer 78 on a surface of the graphene channel 76 opposite the polymer substrate 46, and a graphene electrode 80 on a surface of the gate oxide layer 78 opposite the graphene channel 76. Connections to and from a source and drain of the source select gate 52 are made by on-chip interconnects 82 and 84. Likewise, the ground select gate 54 is formed by a graphene channel 86 on the surface of the polymer substrate 46, a gate oxide layer 88 on a surface of the graphene channel 86 opposite the polymer substrate 46, and a graphene electrode 90 on a surface of the gate oxide layer 88 opposite the graphene channel 86. Connections to and from a source and drain of the ground select gate 54 are made by on-chip interconnects 92 and 94.

The upper deck 44 includes a number of memory cells 96-1 through 96-8 (generally referred to herein collectively as memory cells 96 and individually as memory cell 96). While only eight memory cells 96 are illustrated, it should be appreciated that the GFM device 40 can include any number of memory cells 96 (e.g., millions or trillions of memory cells 96). In this embodiment, the memory cells 96 are configured in a NAND flash memory configuration such that the GFM device 40 is a NAND-type flash memory device.

More specifically, the upper deck 44 includes a polymer interlayer 98 formed on surfaces of the peripheral transistors 48 and 50 and the source and ground select gates 52 and 54 opposite the polymer substrate 46, a graphene channel layer 100 on a surface of the polymer interlayer 98 opposite the peripheral transistors 48 and 50 and the source and ground select gates 52 and 54, and a tunnel oxide layer 102 on a surface of the graphene channel layer 100 opposite the polymer interlayer 98. In this embodiment, the graphene channel layer 100 and the tunnel oxide layer 102 are shared by, or common to, the memory cells 96. The polymer interlayer 98 is generally formed of a polymer. While any suitable polymer may be used, as one example, the polymer is the polymer NFC 1400-3CP (JSR Micro, Inc.), which is commercially available and is a derivative of polyhydroxystyrene. Notably, while in this embodiment, both the polymer substrate 46 and the polymer interlayer 98 are polymer, the GFM device 40 is not limited thereto. Alternatively, other substrate and/or interlayer materials may be used, as will be appreciated by one of ordinary skill in the art upon reading this disclosure.

The graphene channel layer 100 is preferably a monolayer (i.e., a single atomic layer) of graphene. Notably, in the embodiment where the graphene channel layer 100 is a monolayer of graphene, a channel width of each of the memory cells 96 is sufficiently small to open up a bandgap. The channel width corresponds to a control contact, or gate, width of each of the memory cells 96. Preferably, the channel width is less than 20 nm. The isolation of the memory cells 96 from one another and the small channel width opens up a bandgap in the monolayer of graphene. While the graphene channel layer 100 is preferably a monolayer of graphene, the graphene channel layer 100 may alternatively include more than one atomic layer of graphene as long as the graphene channel layer 100 maintains a suitable bandgap. For example, the graphene channel layer 100 may alternatively be a bilayer of graphene (i.e., two atomic layers of graphene).

The tunnel oxide layer 102 is preferably formed of a low-temperature, high dielectric constant (k) oxide such as, for example, $Al_2O_3$, HfO, $SiO_2$, or the like. Further, the tunnel oxide layer 102 has a thickness that is sufficiently thin to allow tunneling of electrons into the graphene channel layer 100 when erasing the memory cells 96. In one embodiment, the thickness of the tunnel oxide layer 102 is in a range of and including 5 to 7 nm.

In addition, for the memory cells 96-1 through 96-8, the GFM device 40 includes corresponding control, or gate, stacks including graphene storage layers 104-1 through 104-8 (generally referred to herein collectively as graphene storage layers 104 and individually as graphene storage layer 104) on a surface of the tunnel oxide layer 102 opposite the graphene channel layer 100, control oxide layers 106-1 through 106-8 (generally referred to herein collectively as control oxide layers 106 and individually as control oxide layer 106) on corresponding surfaces of the graphene storage layers 104-1 through 104-8 opposite the tunnel oxide layer 102, and graphene electrodes 108-1 through 108-8 (generally referred to herein collectively as graphene electrodes 108 and individually as graphene electrode 108) on corresponding surfaces of the control oxide layers 106-1 through 106-8 opposite the graphene storage layers 104-1 through 104-8. The graphene storage layers 104 are formed of one or more atomic layers of graphene (i.e., the graphene storage layer 104-1 includes one or more atomic layers of graphene, etc.). In one embodiment, the graphene storage layers 104 are formed of a monolayer of graphene. In another embodiment, the graphene storage layers 104 are formed of multiple atomic layers of graphene. In one exemplary embodiment, the graphene storage layers 104 are formed of 1 to 4 atomic layers of graphene. The control oxide layers 106 are preferably formed of a low-temperature, high dielectric constant (k) oxide such as, for example, $Al_2O_3$, HfO, $SiO_2$, or the like. The control oxide layers 106 have a thickness that is greater than that of the tunnel oxide layer 102. In one embodiment, a thickness of the control oxide layers 106 is in a range of and including 10 to 30 nm. The graphene electrodes 108 are formed of one or more atomic layers of graphene (i.e., the graphene electrode 108-1 includes one or more atomic layers of graphene, etc.). In one embodiment, the graphene electrodes 108 are formed of a monolayer of graphene. In another embodiment, the graphene electrodes 108 are formed of multiple atomic layers of graphene. In one exemplary embodiment, the graphene electrodes 108 are formed of 1 to 4 atomic layers of graphene.

The memory cells 96 form an array of memory cells connected in series. More specifically, the memory cells 96 are floating gate transistors (i.e., the graphene storage layers 104 form "floating gates" of corresponding transistors) connected in series such that a source of one the memory cells 96 is connected to a drain of the adjacent memory cell 96 in the memory cell array. The source select gate 52 connects the array of memory cells to a bit line formed by the on-chip interconnect 82. Specifically, the source select gate 52 connects the memory cell 96-8 to the bit line when active (i.e., turned on) and disconnects the memory cell 96-8 from the bit line when inactive (i.e., turned off). Similarly, the ground select gate 54 connects the array of memory cells to a ground line formed by the on-chip interconnect 94. Specifically, the ground select gate 54 connects the memory cell 96-1 to the ground line when active (i.e., turned on) and disconnects the memory cell 96-1 from the ground line when inactive (i.e., turned off).

The peripheral circuits formed by the peripheral transistors 48 and 50 in the lower deck 42 perform digital signal processing to program, erase, and read the memory cells 96. Traditionally, peripheral circuitry occupies up to 30% of the die area of a conventional flash memory device. By forming the peripheral circuitry in a separate deck, or layer, of the GFM device 40, the die area is substantially reduced or, alternatively, capacity is increased as a result of additional die area available for the memory cells 96.

As discussed above, using the graphene channel layer 100, the graphene storage layers 104, and the graphene electrodes 108, the GFM device 40 has substantial benefits over the conventional material used for flash memory devices. Specifically, the GFM device 40 has increased scalability and, therefore, increased storage capacity for a given die area. In addition, the GFM device 40 consumes less power than the conventional flash memory device. Also, by using the polymer interlayer 98, the channel mobility of the graphene channel layer 100 is improved.

Figure 4:
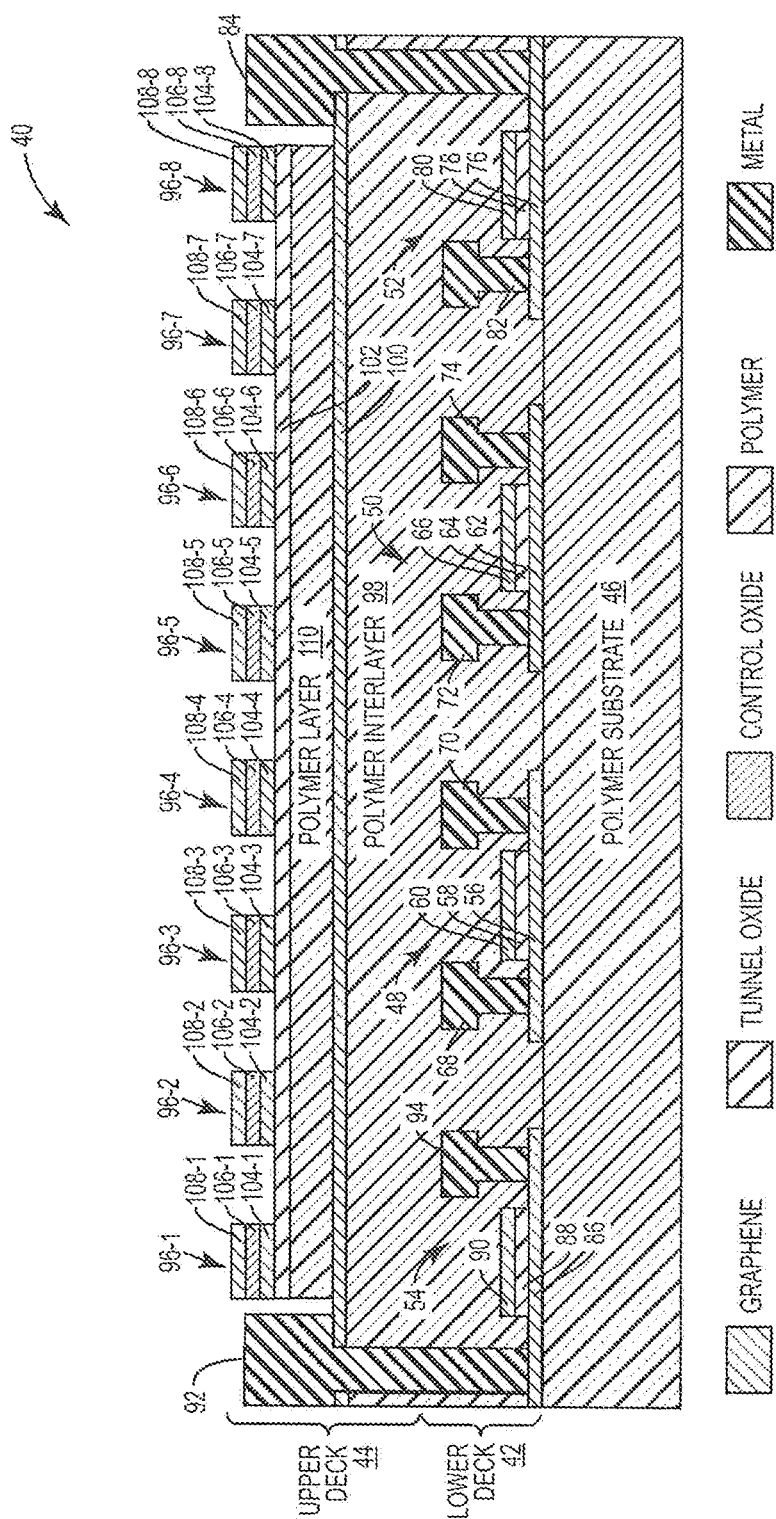
FIG. 4 illustrates a GFM device like that of FIG. 3 but further including a polymer control stack layer according to another embodiment of the present disclosure.

FIG. 4 illustrates the GFM device 40 of FIG. 3 according to another embodiment of the present disclosure. This embodiment is the same as that of FIG. 3 but where an additional polymer layer 110 is included between the graphene channel layer 100 and the tunnel oxide layer 102. The additional polymer layer 110 further enhances the channel mobility of the graphene channel layer 100.

Figure 5:
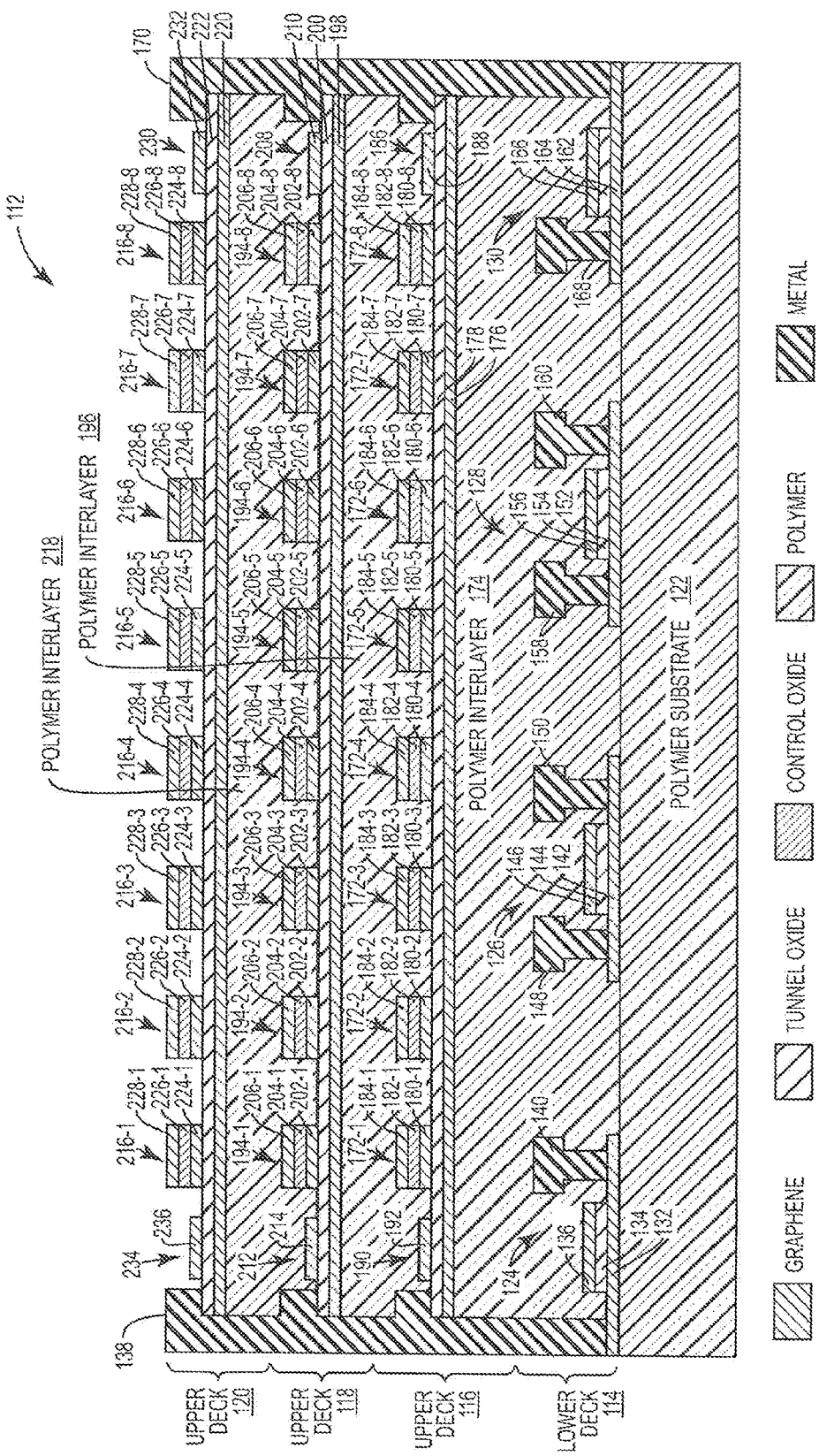
FIG. 5 illustrates a GFM device including multiple memory cell layers according to another embodiment of the present disclosure.

FIG. 5 illustrates a GFM device 112 according to another embodiment of the present disclosure wherein the GFM device 112 includes multiple stacked layers of memory cells. While three layers of memory cells are shown in this example, the GFM device 112 may include any number of two or more stacked layers of memory cells. As illustrated, the GFM device 112 includes multiple stacked layers or "decks," which are referred to as a lower deck 114 and a number of upper decks 116 through 120. More specifically, the GFM device 112 includes a polymer substrate 122, the lower deck 114 on a surface of the polymer substrate 122, the first upper deck 116 on a surface of the lower deck 114 opposite the polymer substrate 122, the second upper deck 118 on a surface of the first upper deck 116 opposite the lower deck 114, and a third upper deck 120 on a surface of the second upper deck 118 opposite the first upper deck 116. The polymer substrate 122 is generally formed of a polymer. While any suitable polymer may be used, as one example, the polymer is the polymer NFC 1400-3CP (JSR Micro, Inc.), which is commercially available and is a derivative of polyhydroxystyrene. It should be noted that the GFM device 112 may alternatively be formed on another type of substrate such as, but not limited to, a Silicon substrate.

The lower deck 114 includes a number of peripheral transistors 124 through 130 forming one or more peripheral circuits. The peripheral transistor 124 is formed by a graphene channel 132 on the surface of the polymer substrate 122, a gate oxide layer 134 on a surface of the graphene channel 132 opposite the polymer substrate 122, and a graphene electrode 136 on a surface of the gate oxide layer 134 opposite the graphene channel 132. The peripheral transistor 124 is connected to on-chip interconnects 138 and 140, where the on-chip interconnect 138 is a ground line of the GFM device 112. Similarly, the peripheral transistor 126 is formed by a graphene channel 142 on the surface of the polymer substrate 122, a gate oxide layer 144 on a surface of the graphene channel 142 opposite the polymer substrate 122, and a graphene electrode 146 on a surface of the gate oxide layer 144 opposite the graphene channel 142. The peripheral transistor 126 is connected to on-chip interconnects 148 and 150. The peripheral transistor 128 is formed by a graphene channel 152 on the surface of the polymer substrate 122, a gate oxide layer 154 on a surface of the graphene channel 152 opposite the polymer substrate 122, and a graphene electrode 156 on a surface of the gate oxide layer 154 opposite the graphene channel 152. The peripheral transistor 128 is connected to on-chip interconnects 158 and 160. Lastly, the peripheral transistor 130 is formed by a graphene channel layer 162 on the surface of the polymer substrate 122, a gate oxide layer 164 on a surface of the graphene channel layer 162 opposite the polymer substrate 122, and a graphene electrode 166 on a surface of the gate oxide layer 164 opposite the graphene channel layer 162. The peripheral transistor 130 is connected to on-chip interconnects 168 and 170, where the on-chip interconnect 170 is a bit line of the GFM device 112.

The first upper deck 116 includes a number of memory cells 172-1 through 172-8 (generally referred to herein collectively as memory cells 172 and individually as memory cell 172). While only eight memory cells 172 are illustrated, it should be appreciated that the first upper deck 116 of the GFM device 112 can include any number of memory cells 172 (e.g., millions or trillions of memory cells 172). In this embodiment, the memory cells 172 are configured in a NAND flash memory configuration such that the GFM device 112 is a NAND-type flash memory device.

More specifically, the first upper deck 116 includes a polymer interlayer 174 formed on surfaces of the peripheral transistors 124 through 130 opposite the polymer substrate 122, a graphene channel layer 176 on a surface of the polymer interlayer 174 opposite the peripheral transistors 124 through 130, and a tunnel oxide layer 178 on a surface of the graphene channel layer 176 opposite the polymer interlayer 174. In this embodiment, the graphene channel layer 176 and the tunnel oxide layer 178 are shared by, or common to, the memory cells 172. The polymer interlayer 174 is generally formed of a polymer. While any suitable polymer may be used, as one example, the polymer is the polymer NFC 1400-3CP (JSR Micro, Inc.), which is commercially available and is a derivative of polyhydroxystyrene.

The graphene channel layer 176 is preferably a monolayer (i.e., a single layer) of graphene. Notably, in the embodiment where the graphene channel layer 176 is a monolayer of graphene, a channel width of each of the memory cells 172 is sufficiently small to open up a bandgap. The channel width corresponds to a control contact, or gate, width (W) of each of the memory cells 172. Preferably, the channel width is less than 20 nm. The isolation of the memory cells 172 from one another and the small channel width opens up a bandgap in the monolayer of graphene. While the graphene channel layer 176 is preferably a monolayer of graphene, the graphene channel layer 176 may alternatively include more than one atomic layer of graphene as long as the graphene channel layer 176 maintains a suitable bandgap. For example, the graphene channel layer 176 may alternatively be a bilayer of graphene (i.e., two atomic layers of graphene).

The tunnel oxide layer 178 is preferably formed of a low-temperature, high dielectric constant (k) oxide such as, for example, $Al_2O_3$, HfO, $SiO_2$, or the like. Further, the tunnel oxide layer 178 has a thickness that is sufficiently thin to allow tunneling of electrons into the graphene channel layer 176 when erasing the memory cells 172. In one embodiment, the thickness of the tunnel oxide layer 178 is in a range of and including 5 to 7 nm.

In addition, for the memory cells 172-1 through 172-8, the first upper deck 116 of the GFM device 112 includes corresponding control, or gate, stacks including graphene storage layers 180-1 through 180-8 (generally referred to herein collectively as graphene storage layers 180 and individually as graphene storage layer 180) on a surface of the tunnel oxide layer 178 opposite the graphene channel layer 176, control oxide layers 182-1 through 182-8 (generally referred to herein collectively as control oxide layers 182 and individually as control oxide layer 182) on corresponding surfaces of the graphene storage layers 180-1 through 180-8 opposite the tunnel oxide layer 178, and graphene electrodes 184-1 through 184-8 (generally referred to herein collectively as graphene electrodes 184 and individually as graphene electrode 184) on corresponding surfaces of the control oxide layers 182-1 through 182-8 opposite the graphene storage layers 180-1 through 180-8. The graphene storage layers 180 are formed of one or more atomic layers of graphene (i.e., the graphene storage layer 180-1 includes one or more atomic layers of graphene, etc.). In one embodiment, the graphene storage layers 180 are formed of a monolayer of graphene. In another embodiment, the graphene storage layers 180 are formed of multiple atomic layers of graphene. In one exemplary embodiment, the graphene storage layers 180 are formed of 1 to 4 atomic layers of graphene. The control oxide layers 182 are preferably formed of a low-temperature, high dielectric constant (k) oxide such as, for example, $Al_2O_3$, HfO, $SiO_2$, or the like. The control oxide layers 182 have a thickness that is greater than that of the tunnel oxide layer 178. In one embodiment, a thickness of the control oxide layers 182 is in a range of and including 10 to 30 nm. The graphene electrodes 184 are formed of one or more atomic layers of graphene (i.e., the graphene electrode 184-1 includes one or more atomic layers of graphene, etc.). In one embodiment, the graphene electrodes 184 are formed of a monolayer of graphene. In another embodiment, the graphene electrodes 184 are formed of multiple atomic layers of graphene. In one exemplary embodiment, the graphene electrodes 184 are formed of 1 to 4 atomic layers of graphene.

The memory cells 172 form an array of memory cells connected in series. More specifically, the memory cells 172 are floating gate transistors (i.e., the graphene storage layers 180 form "floating gates" of corresponding transistors) connected in series such that a source of one the memory cells 172 is connected to a drain of the adjacent memory cell 172 in the memory cell array. A source select gate 186 is formed by a graphene electrode 188 on the surface of the tunnel oxide layer 178 opposite the graphene channel layer 176 and operates to connect the array of memory cells to the bit line formed by the on-chip interconnect 170. Specifically, the source select gate 186 connects the memory cell 172-8 to the bit line when active (i.e., turned on) and disconnects the memory cell 172-8 from the bit line when inactive (i.e., turned off). Similarly, a ground select gate 190 is formed by a graphene electrode 192 on the surface of the tunnel oxide layer 178 opposite the graphene channel layer 176 and operates to connect the array of memory cells to the ground line formed by the on-chip interconnect 138. Specifically, the ground select gate 190 connects the memory cell 172-1 to the ground line when active (i.e., turned on) and disconnects the memory cell 172-1 from the ground line when inactive (i.e., turned off).

The second upper deck 118 includes a number of memory cells 194-1 through 194-8 (generally referred to herein collectively as memory cells 194 and individually as memory cell 194). While only eight memory cells 194 are illustrated, it should be appreciated that the second upper deck 118 of the GFM device 112 can include any number of memory cells 194 (e.g., millions or trillions of memory cells 194). In this embodiment, the memory cells 194 are configured in a NAND flash memory configuration such that the GFM device 112 is a NAND-type flash memory device.

More specifically, the second upper deck 118 includes a polymer interlayer 196 formed on surfaces of the memory cells 172 opposite the polymer interlayer 174, a graphene channel layer 198 on a surface of the polymer interlayer 196 opposite the memory cells 172, and a tunnel oxide layer 200 on a surface of the graphene channel layer 198 opposite the polymer interlayer 196. In this embodiment, the graphene channel layer 198 and the tunnel oxide layer 200 are shared by, or common to, the memory cells 194. The polymer interlayer 196 is generally formed of a polymer. While any suitable polymer may be used, as one example, the polymer is the polymer NFC 1400-3CP (JSR Micro, Inc.), which is commercially available and is a derivative of polyhydroxystyrene.

The graphene channel layer 198 is preferably a monolayer (i.e., a single layer) of graphene. Notably, in the embodiment where the graphene channel layer 198 is a monolayer of graphene, a channel width of each of the memory cells 194 is sufficiently small to open up a bandgap. The channel width corresponds to a control contact, or gate, width (W) of each of the memory cells 194. Preferably, the channel width is less than 20 nm. The isolation of the memory cells 172 from one another and the small channel width opens up a bandgap in the monolayer of graphene. While the graphene channel layer 198 is preferably a monolayer of graphene, the graphene channel layer 198 may alternatively include more than one atomic layer of graphene as long as the graphene channel layer 198 maintains a suitable bandgap. For example, the graphene channel layer 198 may alternatively be a bilayer of graphene (i.e., two atomic layers of graphene).

The tunnel oxide layer 200 is preferably formed of a low-temperature, high dielectric constant (k) oxide such as, for example, $Al_2O_3$, HfO, $SiO_2$, or the like. Further, the tunnel oxide layer 200 has a thickness that is sufficiently thin to allow tunneling of electrons into the graphene channel layer 198 when erasing the memory cells 194. In one embodiment, the thickness of the tunnel oxide layer 200 is in a range of and including 5 to 7 nm.

In addition, for the memory cells 194-1 through 194-8, the second upper deck 118 of the GFM device 112 includes corresponding control, or gate, stacks including graphene storage layers 202-1 through 202-8 (generally referred to herein collectively as graphene storage layers 202 and individually as graphene storage layer 202) on a surface of the tunnel oxide layer 200 opposite the graphene channel layer 198, control oxide layers 204-1 through 204-8 (generally referred to herein collectively as control oxide layers 204 and individually as control oxide layer 204) on corresponding surfaces of the graphene storage layers 202-1 through 202-8 opposite the tunnel oxide layer 200, and graphene electrodes 206-1 through 206-8 (generally referred to herein collectively as graphene electrodes 206 and individually as graphene electrode 206) on corresponding surfaces of the control oxide layers 204-1 through 204-8 opposite the graphene storage layers 202-1 through 202-8. The graphene storage layers 202 are formed of one or more atomic layers of graphene (i.e., the graphene storage layer 202-1 includes one or more atomic layers of graphene, etc.). In one embodiment, the graphene storage layers 202 are formed of a monolayer of graphene. In another embodiment, the graphene storage layers 202 are formed of multiple atomic layers of graphene. In one exemplary embodiment, the graphene storage layers 202 are formed of 1 to 4 atomic layers of graphene. The control oxide layers 204 are preferably formed of a low-temperature, high dielectric constant (k) oxide such as, for example, $Al_2O_3$, HfO, $SiO_2$, or the like. The control oxide layers 204 have a thickness that is greater than that of the tunnel oxide layer 200. In one embodiment, a thickness of the control oxide layers 204 is in a range of and including 10 to 30 nm. The graphene electrodes 206 are formed of one or more atomic layers of graphene (i.e., the graphene electrode 206-1 includes one or more atomic layers of graphene, etc.). In one embodiment, the graphene electrodes 206 are formed of a monolayer of graphene. In another embodiment, the graphene electrodes 206 are formed of multiple atomic layers of graphene. In one exemplary embodiment, the graphene electrodes 206 are formed of 1 to 4 atomic layers of graphene.

The memory cells 194 form an array of memory cells connected in series. More specifically, the memory cells 194 are floating gate transistors (i.e., the graphene storage layers 202 form "floating gates" of corresponding transistors) connected in series such that a source of one the memory cells 194 is connected to a drain of the adjacent memory cell 194 in the memory cell array. A source select gate 208 is formed by a graphene electrode 210 on the surface of the tunnel oxide layer 200 opposite the graphene channel layer 198 and operates to connect the array of memory cells to the bit line formed by the on-chip interconnect 170. Specifically, the source select gate 208 connects the memory cell 194-8 to the bit line when active (i.e., turned on) and disconnects the memory cell 194-8 from the bit line when inactive (i.e., turned off). Similarly, a ground select gate 212 is formed by a graphene electrode 214 on the surface of the tunnel oxide layer 200 opposite the graphene channel layer 198 and operates to connect the array of memory cells to the ground line formed by the on-chip interconnect 138. Specifically, the ground select gate 212 connects the memory cell 194-1 to the ground line when active (i.e., turned on) and disconnects the memory cell 194-1 from the ground line when inactive (i.e., turned off).

The third upper deck 120 includes a number of memory cells 216-1 through 216-8 (generally referred to herein collectively as memory cells 216 and individually as memory cell 216). While only eight memory cells 216 are illustrated, it should be appreciated that the third upper deck 120 of the GFM device 112 can include any number of memory cells 216 (e.g., millions or trillions of memory cells 216). In this embodiment, the memory cells 216 are configured in a NAND flash memory configuration such that the GFM device 112 is a NAND-type flash memory device.

More specifically, the third upper deck 120 includes a polymer interlayer 218 formed on surfaces of the memory cells 194 opposite the polymer interlayer 196, a graphene channel layer 220 on a surface of the polymer interlayer 218 opposite the memory cells 194, and a tunnel oxide layer 222 on a surface of the graphene channel layer 220 opposite the polymer interlayer 218. In this embodiment, the graphene channel layer 220 and the tunnel oxide layer 222 are shared by, or common to, the memory cells 216. The polymer interlayer 218 is generally formed of a polymer. While any suitable polymer may be used, as one example, the polymer is the polymer NFC 1400-3CP (JSR Micro, Inc.), which is commercially available and is a derivative of polyhydroxystyrene.

The graphene channel layer 220 is preferably a monolayer (i.e., a single layer) of graphene. Notably, in the embodiment where the graphene channel layer 220 is a monolayer of graphene, a channel width of each of the memory cells 216 is sufficiently small to open up a bandgap. The channel width corresponds to a control contact, or gate, width (W) of each of the memory cells 216. Preferably, the channel width is less than 20 nm. The isolation of the memory cells 216 from one another and the small channel width opens up a bandgap in the monolayer of graphene. While the graphene channel layer 220 is preferably a monolayer of graphene, the graphene channel layer 220 may alternatively include more than one atomic layer of graphene as long as the graphene channel layer 220 maintains a suitable bandgap. For example, the graphene channel layer 220 may alternatively be a bilayer of graphene (i.e., two atomic layers of graphene). Notably, while in this embodiment, both the polymer substrate 122 and the polymer interlayers 174, 196, and 218 are polymer, the GFM device 112 is not limited thereto. Alternatively, other substrate and/or interlayer materials may be used, as will be appreciated by one of ordinary skill in the art upon reading this disclosure.

The tunnel oxide layer 222 is preferably formed of a low-temperature, high dielectric constant (k) oxide such as, for example, $Al_2O_3$, HfO, $SiO_2$, or the like. Further, the tunnel oxide layer 222 has a thickness that is sufficiently thin to allow tunneling of electrons into the graphene channel layer 220 when erasing the memory cells 216. In one embodiment, the thickness of the tunnel oxide layer 222 is in a range of and including 5 to 7 nm.

In addition, for the memory cells 216-1 through 216-8, the third upper deck 120 of the GFM device 112 includes corresponding control, or gate, stacks including graphene storage layers 224-1 through 224-8 (generally referred to herein collectively as graphene storage layers 224 and individually as graphene storage layer 224) on a surface of the tunnel oxide layer 222 opposite the graphene channel layer 220, control oxide layers 226-1 through 226-8 (generally referred to herein collectively as control oxide layers 226 and individually as control oxide layer 226) on corresponding surfaces of the graphene storage layers 224-1 through 224-8 opposite the tunnel oxide layer 222, and graphene electrodes 228-1 through 228-8 (generally referred to herein collectively as graphene electrodes 228 and individually as graphene electrode 228) on corresponding surfaces of the control oxide layers 226-1 through 226-8 opposite the graphene storage layers 224-1 through 224-8. The graphene storage layers 224 are formed of one or more atomic layers of graphene (i.e., the graphene storage layer 224-1 includes one or more atomic layers of graphene, etc.). In one embodiment, the graphene storage layers 224 are formed of a monolayer of graphene. In another embodiment, the graphene storage layers 224 are formed of multiple atomic layers of graphene. In one exemplary embodiment, the graphene storage layers 224 are formed of 1 to 4 atomic layers of graphene. The control oxide layers 226 are preferably formed of a low-temperature, high dielectric constant (k) oxide such as, for example, $Al_2O_3$, $HfO$, $SiO_2$, or the like. The control oxide layers 226 have a thickness that is greater than that of the tunnel oxide layer 222. In one embodiment, a thickness of the control oxide layers 226 is in a range of and including 10 to 30 nm. The graphene electrodes 228 are formed of one or more atomic layers of graphene (i.e., the graphene electrode 228-1 includes one or more atomic layers of graphene, etc.). In one embodiment, the graphene electrodes 228 are formed of a monolayer of graphene. In another embodiment, the graphene electrodes 228 are formed of multiple atomic layers of graphene. In one exemplary embodiment, the graphene electrodes 228 are formed of 1 to 4 atomic layers of graphene.

The memory cells 216 form an array of memory cells connected in series. More specifically, the memory cells 216 are floating gate transistors (i.e., the graphene storage layers 224 form "floating gates" of corresponding transistors) connected in series such that a source of one the memory cells 216 is connected to a drain of the adjacent memory cell 216 in the memory cell array. A source select gate 230 is formed by a graphene electrode 232 on the surface of the tunnel oxide layer 222 opposite the graphene channel layer 220 and operates to connect the array of memory cells to the bit line formed by the on-chip interconnect 170. Specifically, the source select gate 230 connects the memory cell 216-8 to the bit line when active (i.e., turned on) and disconnects the memory cell 216-8 from the bit line when inactive (i.e., turned off). Similarly, a ground select gate 234 is formed by a graphene electrode 236 on the surface of the tunnel oxide layer 222 opposite the graphene channel layer 220 and operates to connect the array of memory cells to the ground line formed by the on-chip interconnect 138. Specifically, the ground select gate 234 connects the memory cell 216-1 to the ground line when active (i.e., turned on) and disconnects the memory cell 216-1 from the ground line when inactive (i.e., turned off).

The peripheral circuits formed by the peripheral transistors 124 through 130 in the lower deck 114 perform digital signal processing to program, erase, and read the memory cells 172, 194, and 216. Traditionally, peripheral circuitry occupies up to 30% of the die area of a conventional flash memory device. By forming the peripheral circuitry in a separate deck, or layer, of the GFM device 112, the die area is substantially reduced or, alternatively, capacity is increased as a result of additional die area available for the memory cells 172, 194, and 216.

As discussed above, using the graphene channel layers 176, 198, and 220, the graphene storage layers 180, 202, and 224, and the graphene electrodes 184, 206, and 228, the GFM device 112 has substantial benefits over the conventional material used for flash memory devices. Specifically, the GFM device 112 has increased scalability and, therefore, increased storage capacity for a given die area. In addition, the GFM device 112 consumes less power than the conventional flash memory device. Also, by using the polymer interlayers 174, 196, and 218, the channel mobility of the corresponding graphene channel layers 176, 198, and 220 is improved.

Figure 6:
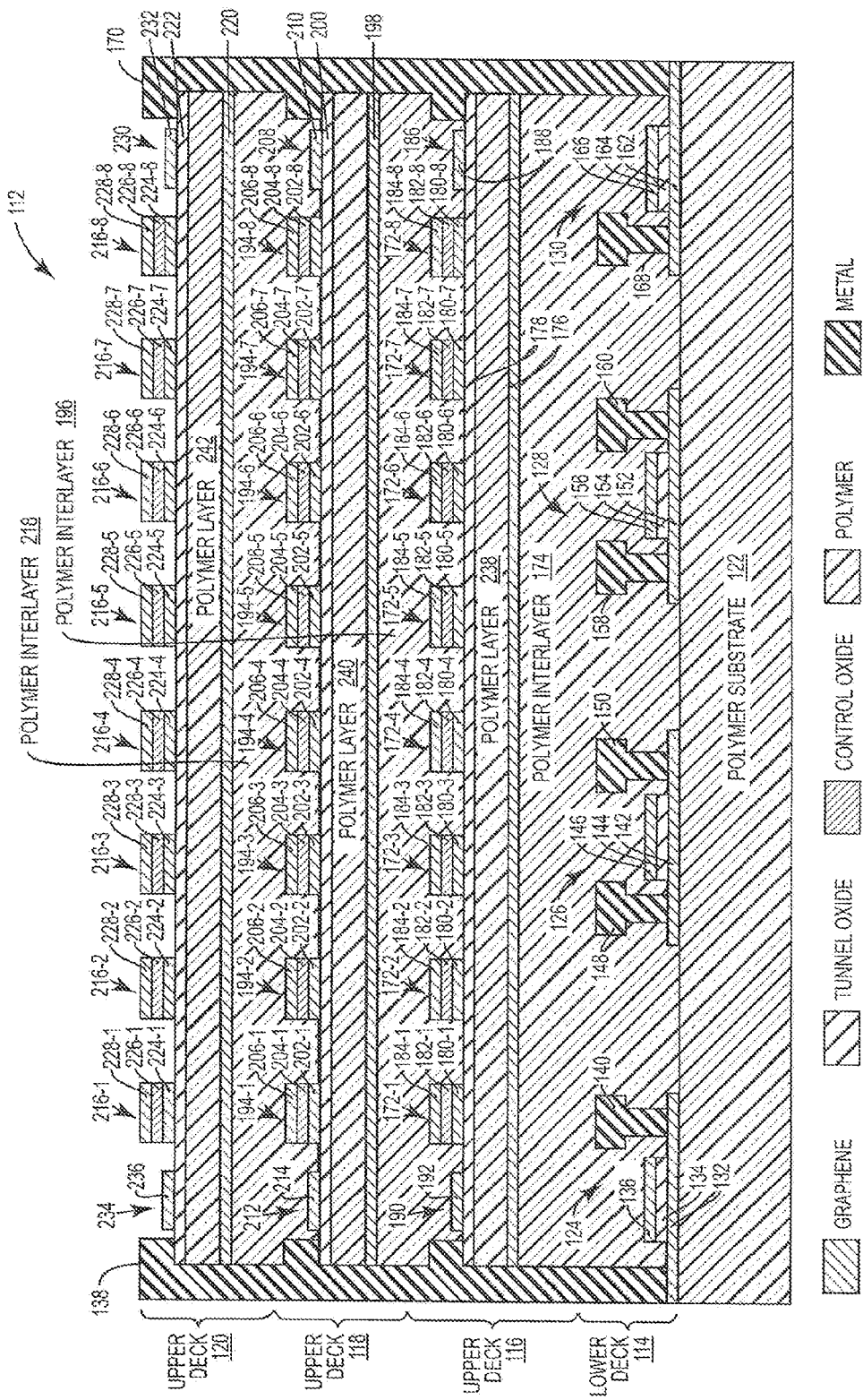
FIG. 6 illustrates a GFM device like that of FIG. 5 but further including a polymer control stack layer according to another embodiment of the present disclosure.

FIG. 6 illustrates the GFM device 112 of FIG. 5 according to another embodiment of the present disclosure. This embodiment is the same as that of FIG. 5 but where additional polymer layers 238, 240, and 242 are included between the graphene channel layers 176, 198, and 220 and the corresponding tunnel oxide layers 178, 200, and 222. The additional polymer layers 238, 240, and 242 further enhance the channel mobility of the graphene channel layers 176, 198, and 220.

Figure 7A:
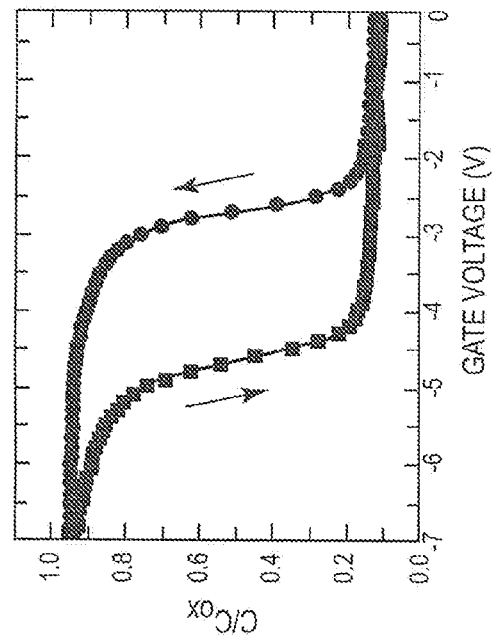
FIGS. 7A through 7C illustrate performance characteristics of memory cells of exemplary GFM devices according to one embodiment of the present disclosure.
Figure 7B:
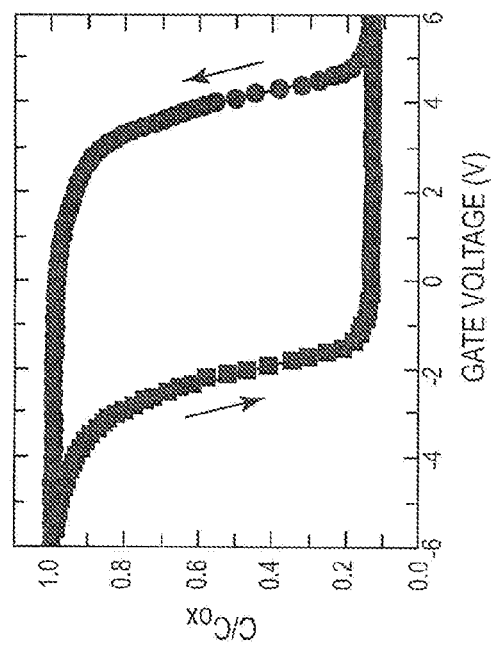
Figure 7C:
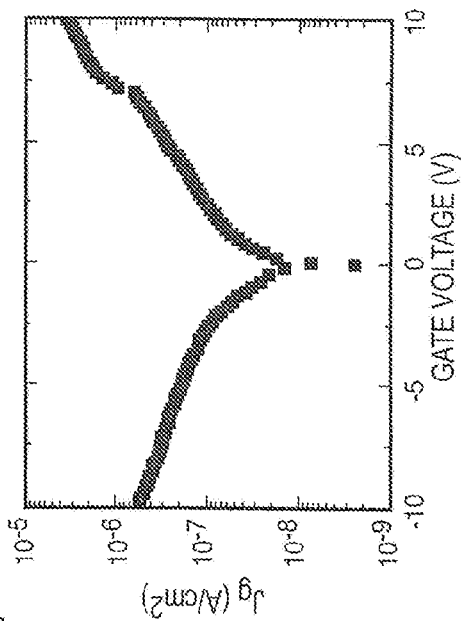

FIGS. 7A through 7C illustrate performance characteristics of memory cells of two exemplary GFM devices. More specifically, FIGS. 7A and 7B graphically illustrate memory windows for the memory cells 12, 96, 172, 194, and 216 of exemplary embodiments of the GFM devices 10, 40, and 112 according to one embodiment of the present disclosure. Specifically, FIG. 7A illustrates a Capacitance versus Voltage (C-V) characteristic of an exemplary memory cell including a graphene storage layer that includes multiple atomic layers of graphene. The C-V characteristic shows a counter-clockwise memory effect, as indicated by arrows, where electron transfer through the tunnel oxide layer dominates electron charge-discharge rate. As illustrated, the memory effect has a relatively large window at low voltages. Specifically, in this example, the memory cell has a ~6 V memory window with a ±7 V sweep (i.e., ±7 V program/erase voltages). This corresponds to a stored charge of $1.6 \times 10^{-6}$ $C/cm^2$. In contrast, industry standards suggest a minimum memory window of 1.5 V to produce a reasonable on-off ratio. For a conventional polycrystalline Silicon floating gate flash memory device, this requires a program/erase voltage of ±20 V.

FIG. 7B illustrates a C-V characteristic of an exemplary memory cell including a monolayer of graphene as a graphene storage layer. The C-V characteristic shows a counter-clockwise memory effect, as indicated by arrows, where electron transfer through the tunnel oxide layer dominates electron charge-discharge rate. As illustrated, the memory cell has a ~2 V memory window with a ±7 V sweep (i.e., ±7 V program/erase voltages). This corresponds to a stored charge of $5.33 \times 10^{-7}$ $C/cm^2$. Notably, the larger memory window width for the multi-layer graphene (FIG. 7A) is directly attributable to a larger thickness as compared to that of the monolayer of graphene (FIG. 7B). The smaller memory window width of the monolayer of graphene is a result of the graphene storage layer being only one atom thick (~0.35 nm), which is thinner than the interlayer screening length of the multi-layer graphene ($\lambda = 0.6 \sim 1.2$ nm).

FIG. 7C illustrates leakage current for an exemplary memory cell of one of the GFM devices 10, 40, and 112 according to one embodiment of the present disclosure. A minimal leakage current of $7 \times 10^{-7}$ $A/cm^2$ at −10V corroborates charge transfer through the tunnel oxide layer.

FIGS. 8A and 8B graphically compare cell-to-cell interference for an exemplary embodiment of one of the GFM devices 10, 40, and 112 to that of a conventional floating gate flash memory device. To understand the maximum cell-to-cell interference on a given memory cell, FIGS. 8A and 8B show the situation where two nearest neighbors of the given memory cell are programmed at high gate voltages, while the given memory cell of interest remains unprogrammed. The cell-to-cell interference for the given memory cell is the shift in the threshold voltage of the given memory cell due to its nearest neighbors. As shown, the conventional floating gate (FG) memory cell experiences abruptly increasing interference as the memory cell device is scaled down below a 25 nm feature size. However, the memory cell of the GFM device 10, 40, and 112 experiences negligible interference down to a 10 nm feature size, which in this example is gate width.

FIGS. 9A through 9D illustrate the electric potential and hole concentration for memory cells of an exemplary embodiment of the GFM device 10, 40, and 112 having 5 nm feature sizes during two read operations. Specifically, in this example, the GFM devices 10, 40, and 112 have a 5 nm gate length, 5 nm spacing, and a 7 nm control, or gate, stack. FIGS. 9A and 9C illustrate the electrical potential of the memory cells and the hole concentration in the graphene channel layer during a read operation for the center memory cell when the center memory cell has been programmed. During the read operation, the ground line is connected to, for example, 0 V, and the bit line is connected to, for example, 4 V. In addition, a high voltage is applied to the graphene electrodes (i.e., the control or gate electrodes) of the memory cells other than the center memory cell to be read. This voltage is sufficient to turn on all of the other memory cells regardless of their memory state (i.e., programmed or erased). An intermediate voltage is applied to the graphene electrode of the center memory cell. This intermediate voltage is such that the center memory cell will be turned on if the center memory cell is erased (storing "1") and remain off if the center memory cell is programmed (storing "0"). In other words, this intermediate voltage is a voltage between a low threshold voltage of the memory cell when in the erased state and a high threshold voltage of the memory cell when in the programmed state. In this case, the memory cell is programmed (i.e., storing a "0" such that the threshold voltage is the high threshold voltage). As such, the center memory cell remains off and current is not conducted through the graphene channel layer. The lack of current conduction is read (e.g., by the peripheral circuit(s)) as a "0."

FIGS. 9B and 9D illustrate the electrical potential of the memory cells and the hold concentration in the graphene channel layer during a read operation for the center memory cell when the center memory cell has been erased (i.e., stores a "1"). During the read operation, the ground line is connected to, for example, 0 V, and the bit line is connected to, for example, 4 V. In addition, a high voltage is applied to the graphene electrodes (i.e., the control or gate electrodes) of the memory cells other than the center memory cell to be read. This voltage is sufficient to turn on all of the other memory cells regardless of their memory state (i.e., programmed or erased). An intermediate voltage is applied to the graphene electrode of the center memory cell. This intermediate voltage is such that the center memory cell will be turned on if the center memory cell is erased (storing "1") and remain off if the center memory cell is programmed (storing "0"). In other words, this intermediate voltage is a voltage between a low threshold voltage of the memory cell when in the erased state and a high threshold voltage of the memory cell when in the programmed state. In this case, the memory cell is erased (i.e., storing a "1" such that the threshold voltage is the low threshold voltage). As such, the center memory cell turns on such that current is conducted through the graphene channel layer. The conduction of current is read (e.g., by the peripheral circuit(s)) as a "1."

FIGS. 10A and 10B illustrate the direct current (DC) performance of memory cells of an exemplary embodiment of the GFM device 10, 40, and 112 having a 5 nm feature size. Specifically, FIG. 10A illustrates a drain-to-source current ($I_{DS}$) versus gate-to-source voltage ($V_{GS}$) of the exemplary memory cell. FIG. 10B illustrates the drain-to-source current ($I_{DS}$) versus drain-to-source voltage ($V_{DS}$) of the exemplary memory cell. Together, FIGS. 9A through 9D and FIGS. 10A and 10B show that the GFM device 10, 40, and 112 can be scaled down to at least 5 nm features sizes (and below) and have strong immunity to the Short-Channel-Effect (SCE).

Those skilled in the art will recognize improvements and modifications to the preferred embodiments of the present disclosure. All such improvements and modifications are considered within the scope of the concepts disclosed herein and the claims that follow.

What is claimed is:

1. A Graphene Flash Memory (GFM) device comprising:
   a graphene channel layer;
   a polymer layer over the graphene channel layer;
   a tunnel oxide layer on a surface of the polymer layer opposite the graphene channel layer; and
   a plurality of memory cells on a surface of the tunnel oxide layer opposite the polymer layer, each memory cell of the plurality of memory cells comprising the graphene channel layer, the polymer layer, the tunnel oxide layer, a graphene storage layer, and a graphene electrode.

2. The GFM device of claim 1 wherein the GFM device further comprises:
   a substrate on a surface of the graphene channel layer opposite the polymer layer.

3. The GFM device of claim 2 wherein each memory cell of the plurality of memory cells comprises:
   the polymer layer of the memory cell on the surface of the graphene channel layer opposite the substrate;
   the tunnel oxide layer on the surface of the polymer layer opposite the graphene channel layer;
   the graphene storage layer of the memory cell on the surface of the tunnel oxide layer opposite the polymer layer;
   a control oxide layer on a surface of the graphene storage layer of the memory cell opposite the tunnel oxide layer; and
   the graphene electrode of the memory cell on a surface of the control oxide layer opposite the graphene storage layer of the memory cell.

4. The GFM device of claim 3 wherein the substrate is a polymer substrate.

5. The GFM device of claim 1 wherein the GFM device comprises:
   a substrate;
   one or more peripheral circuits on a surface of the substrate;
   a polymer interlayer on a surface of the one or more peripheral circuits opposite the substrate; and
   the graphene channel layer on a surface of the polymer interlayer opposite the one or more peripheral circuits, wherein the plurality of memory cells are on the graphene channel layer.

6. The GFM device of claim 5 wherein the substrate is a polymer substrate.

7. The GFM device of claim 6 wherein each memory cell of the plurality of memory cells comprises:
   the polymer layer of the memory cell on a surface of the graphene channel layer opposite the polymer interlayer;
   the tunnel oxide layer on the surface of the polymer layer opposite the graphene channel layer;
   the graphene storage layer of the memory cell on the surface of the tunnel oxide layer opposite the polymer layer;
   a control oxide layer on a surface of the graphene storage layer of the memory cell opposite the tunnel oxide layer; and
   the graphene electrode of the memory cell on a surface of the control oxide layer opposite the graphene storage layer of the memory cell.

8. The GFM device of claim 1 further comprising a plurality of stacked layers of memory cells, wherein the plurality of memory cells are included in the plurality of stacked layers of memory cells.

9. The GFM device of claim 8 wherein each layer of memory cells of the plurality of stacked layers of memory cells comprises:
- a polymer base layer;
- the graphene channel layer on a surface of the polymer base layer; and
- a corresponding subset of the plurality of memory cells, each memory cell of the corresponding subset of the plurality of memory cells comprising:
  - the polymer layer of the memory cell on a surface of the graphene channel layer opposite the polymer base layer;
  - the tunnel oxide layer on the surface of the polymer layer opposite the graphene channel layer;
  - the graphene storage layer of the memory cell on the surface of the tunnel oxide layer opposite the polymer layer;
  - a control oxide layer on a surface of the graphene storage layer of the memory cell opposite the tunnel oxide layer; and
  - the graphene electrode of the memory cell on a surface of the control oxide layer opposite the graphene storage layer of the memory cell.

10. The GFM device of claim 8 wherein each layer of memory cells of the plurality of stacked layers of memory cells comprises:
- a polymer base layer;
- the graphene channel layer on a surface of the polymer base layer;
- the polymer layer on a surface of the graphene channel layer opposite the polymer base layer;
- the tunnel oxide layer on the surface of the polymer layer opposite the graphene channel layer; and
- a corresponding subset of the plurality of memory cells, each memory cell of the corresponding subset of the plurality of memory cells comprising:
  - the graphene storage layer of the memory cell on the surface of the tunnel oxide layer opposite the polymer layer;
  - a control oxide layer on a surface of the graphene storage layer of the memory cell opposite the tunnel oxide layer; and
  - the graphene electrode of the memory cell on a surface of the control oxide layer opposite the graphene storage layer of the memory cell.

11. The GFM device of claim 1 wherein the graphene channel layer is a single atomic layer of graphene.

12. The GFM device of claim 11 wherein a channel width of each of the plurality of memory cells is less than or equal to 20 nanometers and the plurality of memory cells are isolated from one another such that a bandgap is opened in the graphene channel layer of the plurality of memory cells.

13. The GFM device of claim 1 wherein the graphene storage layer is 1 to 4 atomic layers of graphene.

14. The GFM device of claim 1 wherein the graphene electrode is 1 to 4 atomic layers of graphene.

15. The GFM device of claim 1 wherein a feature size of the plurality of memory cells is less than 25 nanometers.

16. The GFM device of claim 1 wherein a feature size of the plurality of memory cells is less than or equal to 20 nanometers.

17. The GFM device of claim 1 wherein a feature size of the plurality of memory cells is less than or equal to 15 nanometers.

18. The GFM device of claim 1 wherein a feature size of the plurality of memory cells is less than or equal to 10 nanometers.

19. The GFM device of claim 1 wherein a feature size of the plurality of memory cells is less than or equal to 5 nanometers.

20. A memory cell comprising:
- a graphene channel layer;
- a polymer layer on a surface of the graphene channel layer;
- a tunnel oxide layer on a surface of the polymer layer opposite the graphene channel layer;
- a graphene storage layer on a surface of the tunnel oxide layer opposite the polymer layer;
- a control oxide layer on a surface of the graphene storage layer opposite the tunnel oxide layer; and
- a graphene electrode on a surface of the control oxide layer opposite the graphene storage layer.

21. The memory cell of claim 20 further comprising a polymer base layer on the surface of the graphene channel layer opposite the tunnel oxide layer.

* * * * *